US010554020B2

(12) United States Patent
Tang et al.

(10) Patent No.: US 10,554,020 B2
(45) Date of Patent: Feb. 4, 2020

(54) LED WITH EMITTED LIGHT CONFINED TO FEWER THAN TEN TRANSVERSE MODES

(71) Applicant: Silanna UV Technologies Pte Ltd, Singapore (SG)

(72) Inventors: Johnny Cai Tang, Baulkham Hills (AU); Petar Atanackovic, Henley Beach South (AU)

(73) Assignee: Silanna UV Technologies Pte Ltd, Singapore (SG)

(*) Notice: Subject to any disclaimer, the term of this patent is extended or adjusted under 35 U.S.C. 154(b) by 0 days.

(21) Appl. No.: 16/022,558

(22) Filed: Jun. 28, 2018

(65) Prior Publication Data

US 2019/0006821 A1 Jan. 3, 2019

Related U.S. Application Data

(60) Provisional application No. 62/526,859, filed on Jun. 29, 2017.

(51) Int. Cl.
| | |
|---|---|
| *H01L 33/06* | (2010.01) |
| *H01S 5/227* | (2006.01) |
| *H01S 5/323* | (2006.01) |
| *H01S 5/20* | (2006.01) |
| *H01S 5/10* | (2006.01) |
| *H01S 5/065* | (2006.01) |

(52) U.S. Cl.
CPC ............ *H01S 5/2275* (2013.01); *H01L 33/06* (2013.01); *H01S 5/0655* (2013.01); *H01S 5/1064* (2013.01); *H01S 5/2004* (2013.01); *H01S 5/32341* (2013.01)

(58) Field of Classification Search
CPC combination set(s) only.
See application file for complete search history.

(56) References Cited

U.S. PATENT DOCUMENTS

2011/0073838 A1* 3/2011 Khan ................ H01L 27/153
257/13
2017/0309779 A1 10/2017 Atanackovic

OTHER PUBLICATIONS

Adivarahan et al., High-power deep ultraviolet light-emitting diodes basedon a micro-pixel design, Applied Physics Letters, Sep. 2004, vol. 85 No. 10, http://dx.doi.org/10.1063/1.1784882.

(Continued)

*Primary Examiner* — Quoc D Hoang
(74) *Attorney, Agent, or Firm* — MLO, a professional corp.

(57) ABSTRACT

A light emitting device includes a substrate, a buffer layer, a first active layer, and a plurality of mesa regions. A portion of the first active layer includes a first electrical polarity. The plurality of mesa regions includes at least a portion of the first active layer, a light emitting region on the portion of the first active layer, and a second active layer on the light emitting region. A portion of the second active layer includes a second electrical polarity. The light emitting region is configured to emit light which has a target wavelength between 200 nm to 300 nm. A thickness of the light emitting region is a multiple of the target wavelength, and a dimension of the light emitting region parallel to the substrate is smaller than 10 times the target wavelength, such that the emitted light is confined to fewer than 10 transverse modes.

9 Claims, 32 Drawing Sheets

(56) References Cited

OTHER PUBLICATIONS

Fan et al, III-nitride micro-emitter arrays: development and applications, Journal of Physics D: Applied Physics, Apr. 2008, vol. 41, 12 pages.

Jiang and Lin, Hexagonal boron nitride for deep ultraviolet photonic devices, Semiconductor Science and Technology, Jun. 2014, vol. 29, No. 8, 14 pages.

Khan et al., 255 nm Interconnected Micro-Pixel Deep Ultraviolet Light Emitting Diodes, Electron Devices Meeting, 2004. IEDM Technical Digest. IEEE International, Dec. 2004, pp. 347-350, http://ieeexplore.ieee.org/abstract/document/1419153/.

Wu et al., Micro-pixel Design Milliwatt Power 254nm Emission Light Emitting Diodes, Japanese Journal of Applied Physics, Jul. 2004, vol. 43, No. 8A, pp. L1035-L1037.

\* cited by examiner

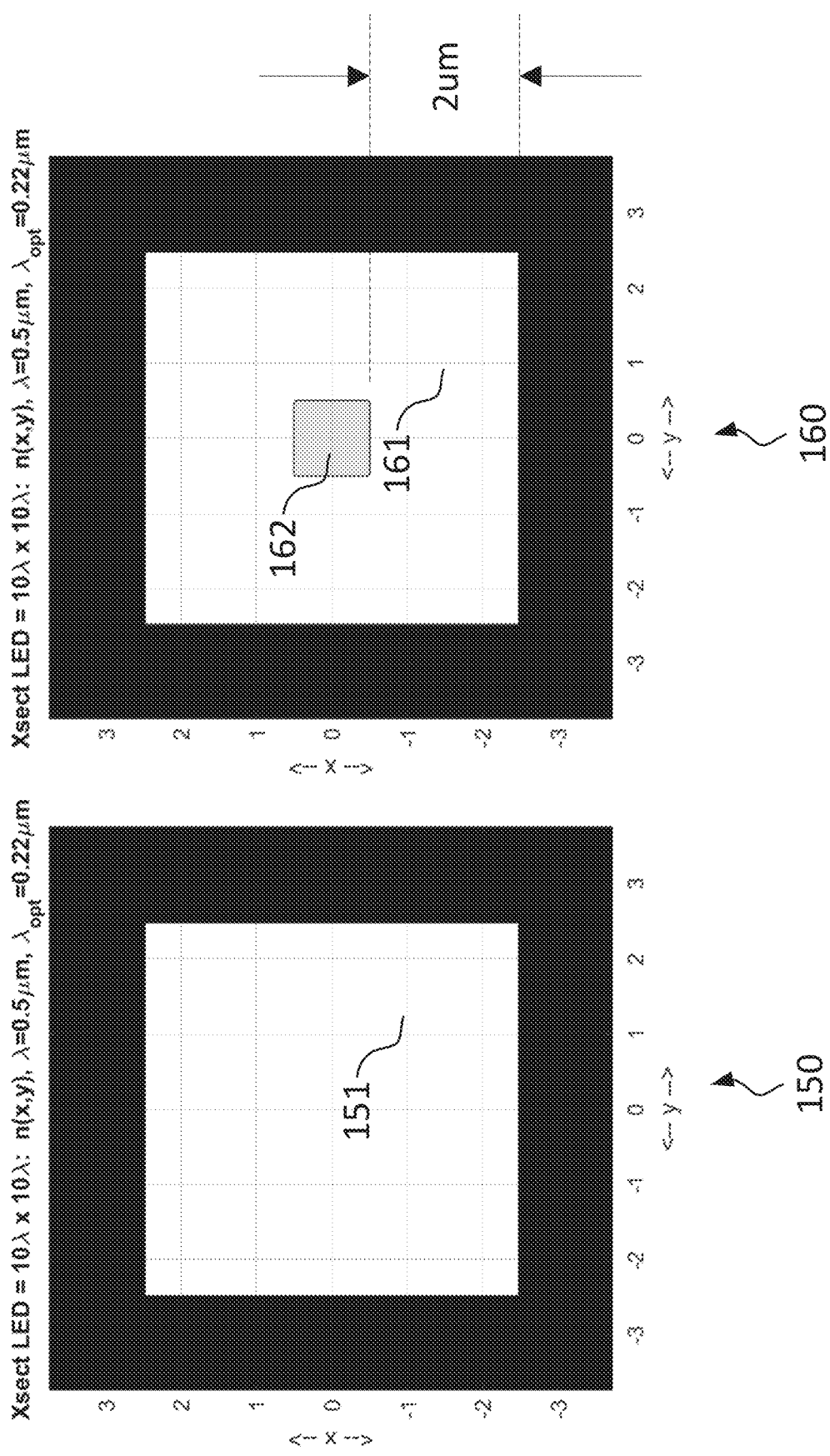

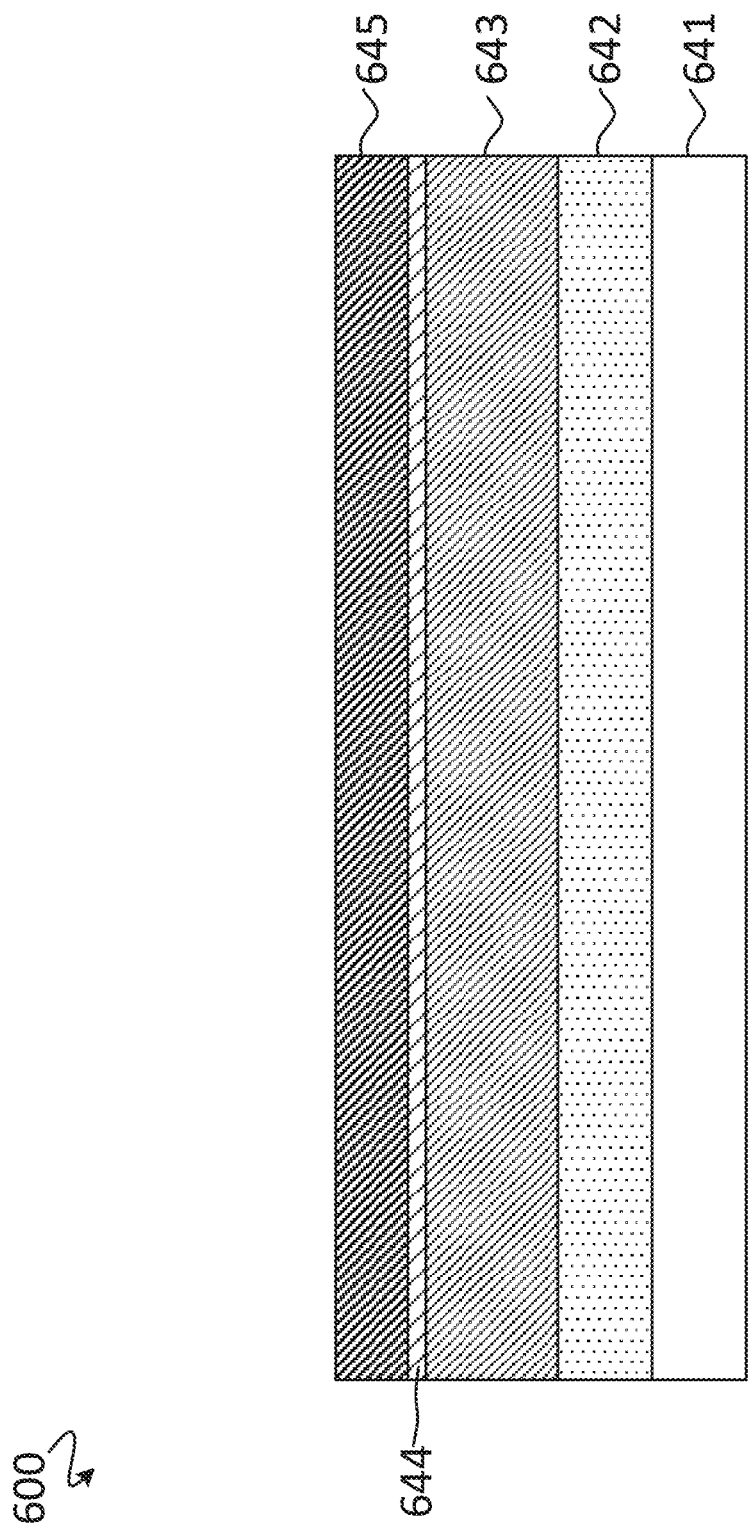

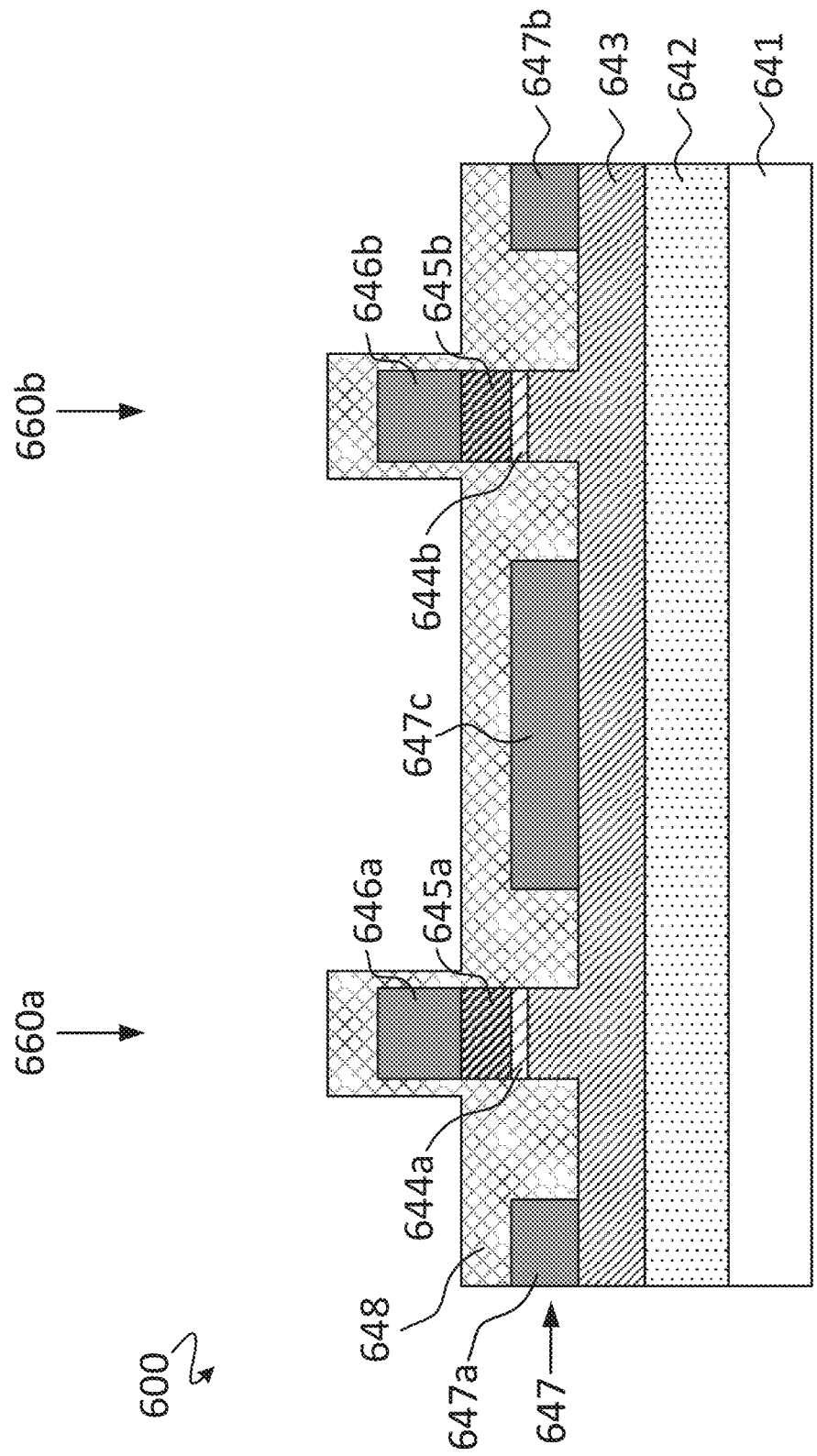

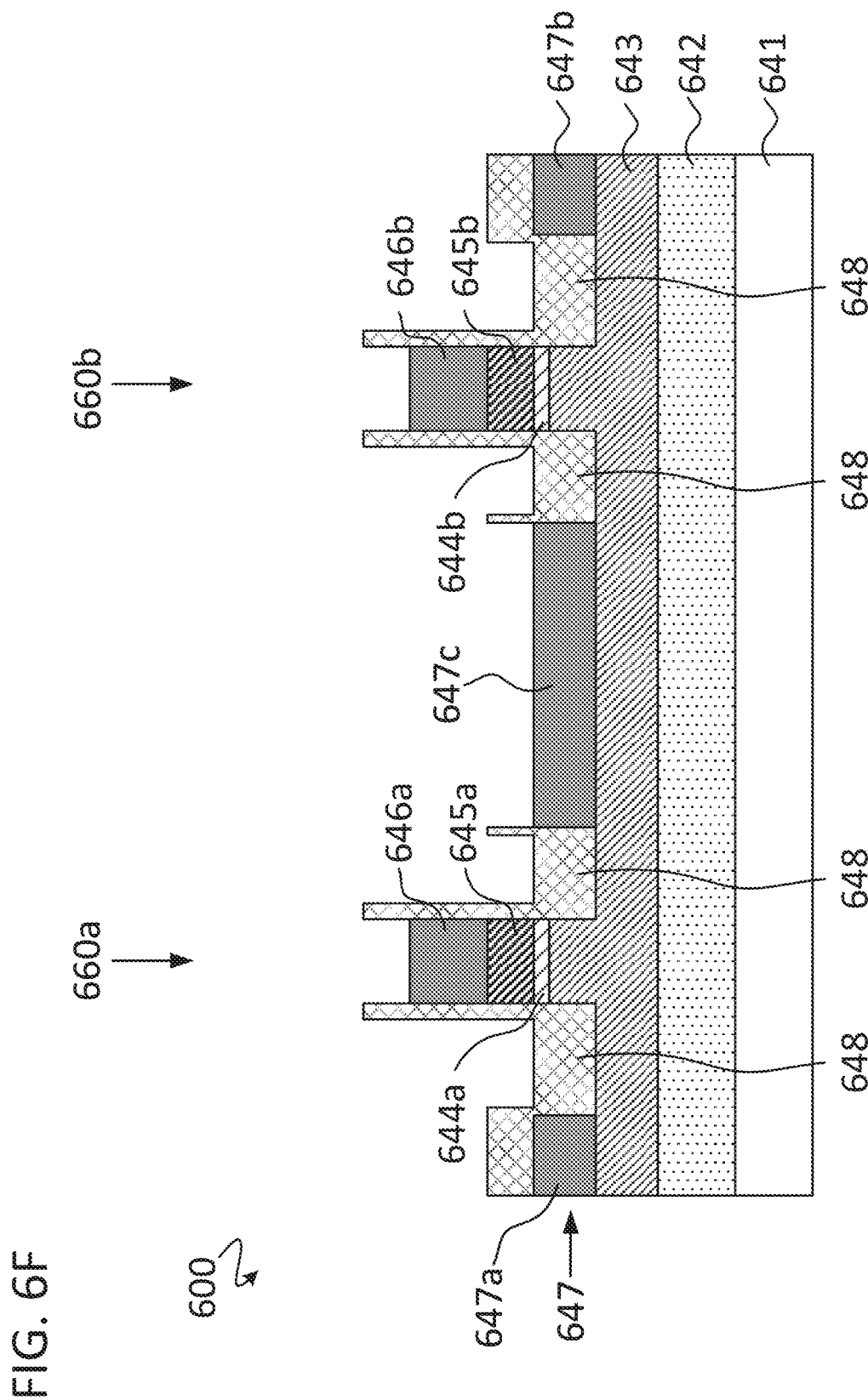

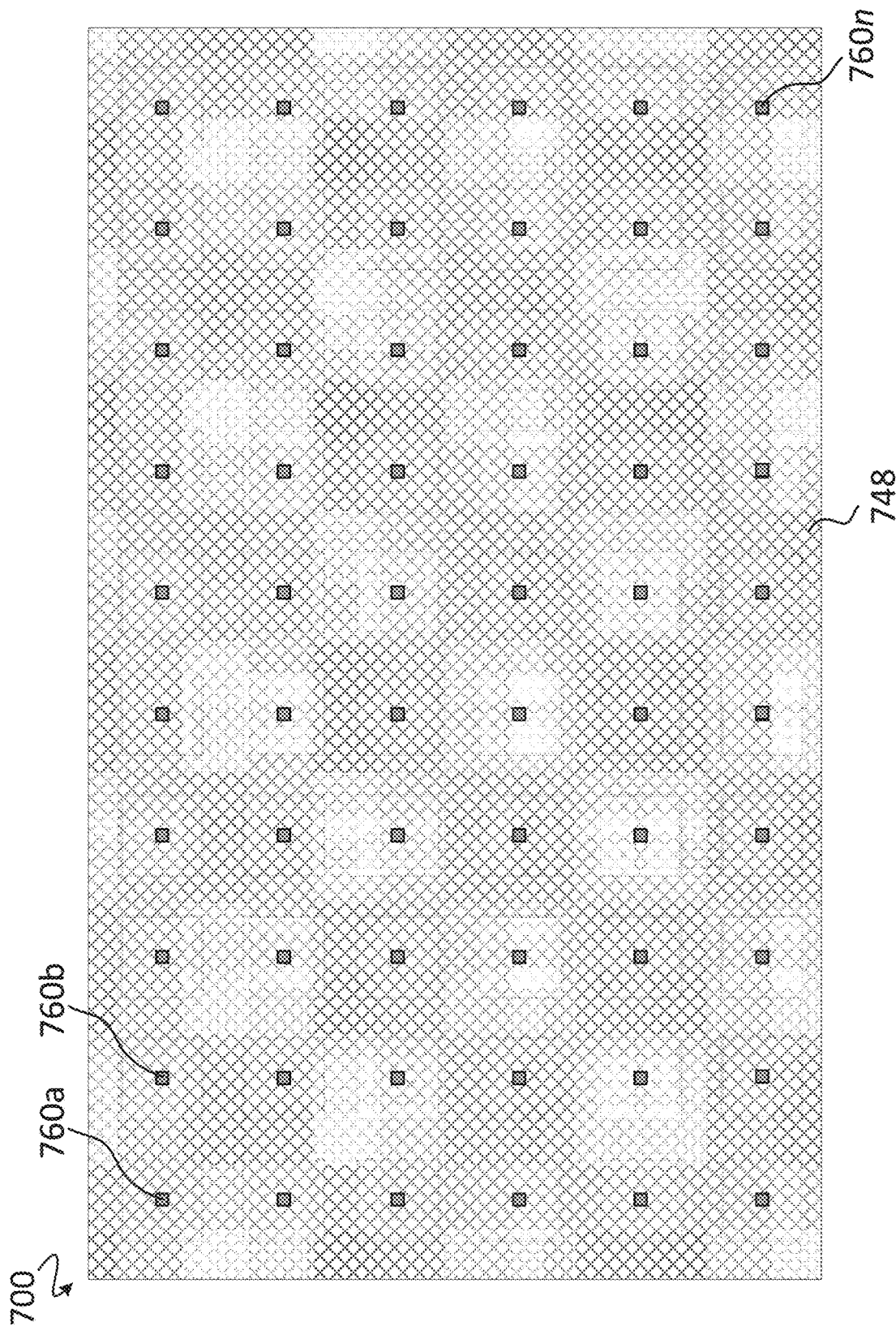

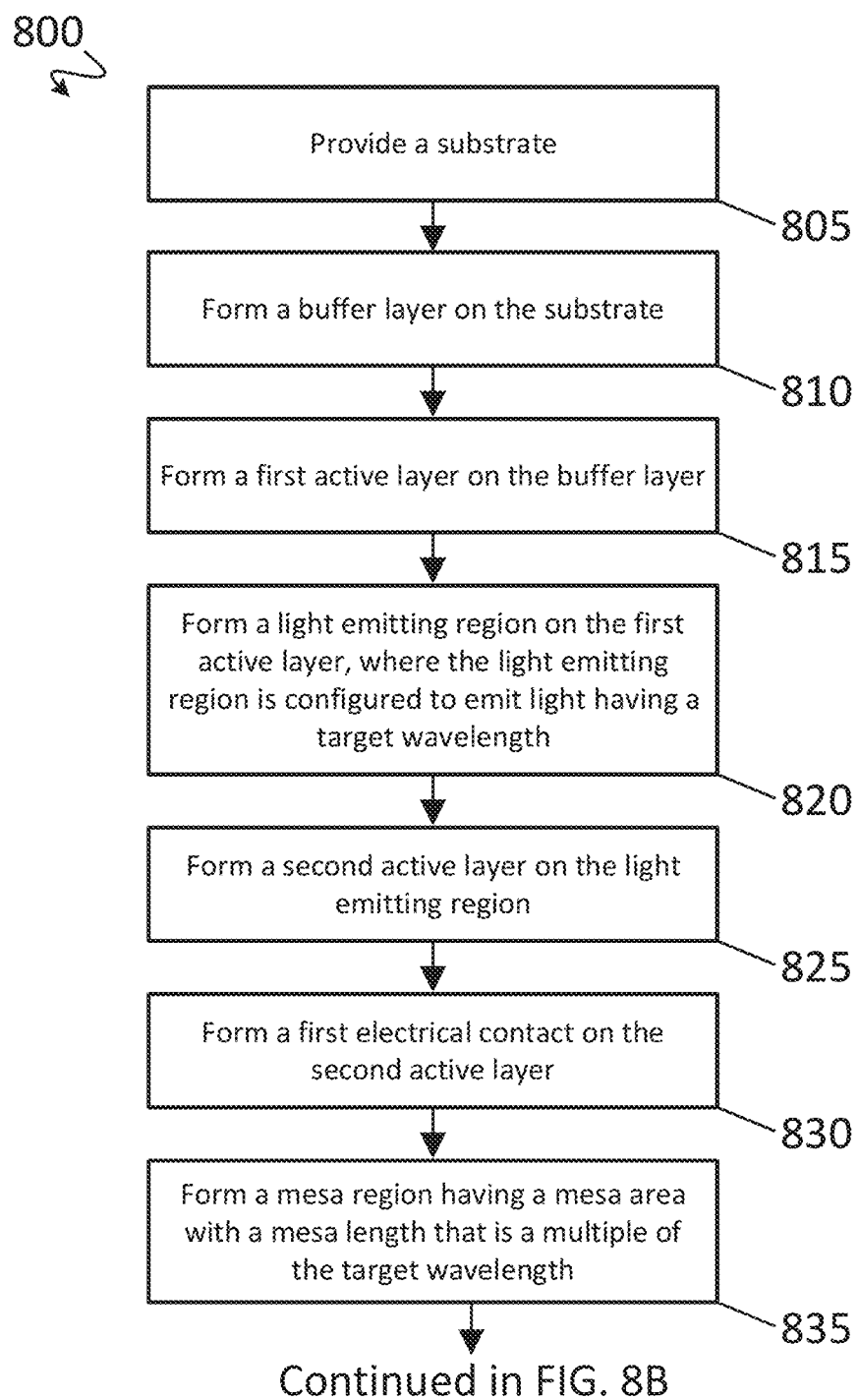

LED WITH EMITTED LIGHT CONFINED TO FEWER THAN TEN TRANSVERSE MODES

RELATED APPLICATIONS

This application claims the benefit of U.S. Provisional Patent Application No. 62/526,859 filed on Jun. 29, 2017, and entitled "SUB-MICRON DEEP-UV LED;" which is hereby incorporated by reference for all purposes.

BACKGROUND

PIN diodes are semiconductor structures having a p-type region, an n-type region, and an intrinsic region between the n-type and p-type regions. In light emitting diodes (LEDs) and laser diodes (LDs), electrons and holes injected from the p-type and n-type regions recombine within the intrinsic region, generating light. The type of materials used for the p-type, intrinsic, and n-type regions in the LED determine the wavelength of light emitted from the device. In particular, LEDs that emit light in the deep ultra-violet (deep-UV) wavelengths (<280 nm) often use group-III metal nitride semiconductor materials, such as aluminum nitride (AlN) or aluminum gallium nitride (AlGaN).

Several critical problems limit deep-UV LED performance with regards to light emission and thermal characteristics. Such limiting factors include current crowding, thermal management, and light extraction. Current crowding is characterized by a non-uniform distribution of current density through a semiconductor. Within a deep-UV LED or LD, current crowding can be caused by high defect densities in the grown group-III nitride films, high resistivities of the n-type and/or p-type regions, and/or low electron and hole carrier mobilities in the films.

Non-uniform distribution of current density contributes to non-uniform electron-hole recombination (EHR) in the light emitting region (e.g., the intrinsic region) of the LED. The regions with lower EHR rates produce less light than the regions with high EHR rates, causing less light emission from the LED in comparison to an ideal LED exhibiting uniformly high EHR rates. Further, current crowding contributes to the formation of "hot spots" (i.e., localized heating) in LEDs, which can result in thermal runaway in extreme cases.

Attempts to mitigate current crowding include attempts to reduce defect densities within the intrinsic region, attempts to improve conductivities within the p-type and/or n-type regions, attempts to improve the semiconductor device geometries (e.g., using about 10 micron width mesas with rectangular or hexagonal shapes), or to utilize different semiconductor device geometries (e.g., forming a vertical conduction device structure using a conducting substrate such as SiC).

In addition to current crowding, deep-UV LED performance is also often limited by inefficient light extraction. That is, group-III metal nitride materials have an inherently high refractive index, which limits the amount of the light generated within the LED that can escape from the surface. Efforts have been made in surface texturing to improve an escape cone of light from the surface. While such solutions have had some success in improving the light emission from deep-UV LEDs, they are still far from achieving optical power densities of commercial significance when compared to UV gas-discharge lamp technologies.

SUMMARY

In some embodiments, a light emitting device includes a substrate, a buffer layer on the substrate, a first active layer on the buffer layer, and a plurality of mesa regions on the first active layer. At least a first portion of the first active layer includes a first electrical polarity. The plurality of mesa regions includes at least a second portion of the first active layer, a light emitting region on the second portion of the first active layer, and a second active layer on the light emitting region. At least a portion of the second active layer includes a second electrical polarity. The light emitting region has a thickness and is configured to emit light which has a target wavelength between 200 nm to 300 nm, or between a quarter micron and a micron. The thickness of the light emitting region is a multiple of the target wavelength, and at least one dimension of the light emitting region parallel to substrate is smaller than 10 times the target wavelength, such that the emitted light is confined to fewer than 10 transverse modes.

In some embodiments, a method for manufacturing a light emitting device involves providing a substrate. The substrate has a substrate area which includes a substrate length and a substrate width. A buffer layer is formed on the substrate. A first active layer is formed on the buffer layer. At least a portion of the first active layer includes a first electrical polarity. A light emitting region is formed on the first active layer. The light emitting region is configured to emit light which has a target wavelength. The target wavelength is between 200 nm and 300 nm, or between a quarter micron and a micron. A second active layer is formed on the light emitting region. At least a portion of the second active layer includes a second electrical polarity. A first electrical contact layer is formed on the second active layer. A portion of the first electrical contact layer, a portion of the second active layer, a portion of the light emitting region, and a portion of the first active layer are removed in an area that is outside of a mesa area and that surrounds the mesa area, to form a mesa. The mesa includes a portion of the first active layer, a portion of the light emitting region, a portion of the second active layer and a portion of the first electrical contact layer. The respective portions each has an area that is equal to the mesa area. The mesa has a mesa top surface and mesa sidewall surfaces. The mesa area includes a mesa length and a mesa width and is smaller than the substrate area. The mesa width is a multiple of the target wavelength, and the mesa width confines the emitted light from the light emitting region to fewer that a predetermined number of modes. A second electrical contact layer is formed on a portion of the exposed first active layer. A passivation layer is formed on the first electrical contact layer, on the second electrical contact layer, on a remaining portion of the exposed first active layer, and on the mesa sidewall surfaces. The first electrical contact layer and the second electrical contact layer are exposer. A first terminal contact layer is formed on the first electrical contact layer, and a second terminal contact layer is formed on the second electrical contact.

BRIEF DESCRIPTION OF THE DRAWINGS

FIG. 1E shows a simplified schematic in plan view of two example LED semiconductor structures, in accordance with some embodiments.

FIGS. 6A-6G are simplified cross-section schematic views of a deep-UV LED at various stages of an example formation process, in accordance with an example embodiment.

FIGS. 7A-7H are simplified plan view schematic views of a deep-UV LED at various stages of an example formation process, in accordance with an example embodiment.

FIGS. 8A-8C are flowcharts of a simplified example process for forming a deep-UV LED, in accordance with an example embodiment.

DETAILED DESCRIPTION

Figure 1A:
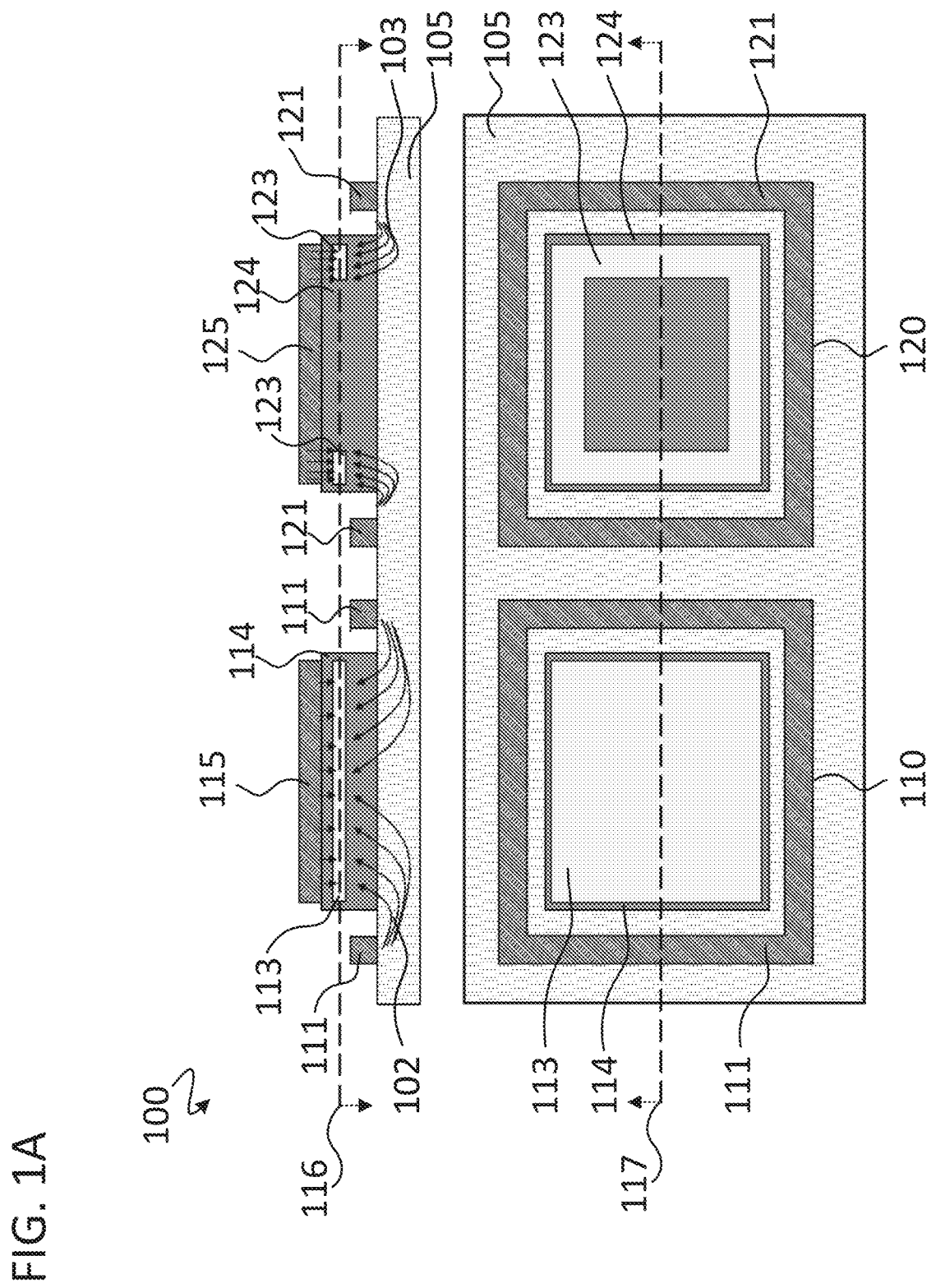
FIG. 1A shows a simplified schematic illustrating ideal current distribution as compared to current distribution impacted by current crowding conditions within two example mesas of a semiconductor structure, in accordance with some embodiments.

New device designs and advanced device fabrication processes are disclosed that improve current spreading (thereby reducing current crowding), provide improved thermal characteristics, reduce series resistance, and offer new approaches to improve and control light extraction from deep-UV LEDs. The term "LED", as used herein, refers to any type of light emitting diode, including a laser diode. In some embodiments, deep-UV LEDs have emission wavelengths from about 200 nm to about 300 nm. Such device designs and processes offer significant potential for future novel deep-UV LEDs devices and applications. Some examples of applications for the deep-UV LEDs described herein include water purification, medical diagnostics, security, and replacements for mercury based deep UV lamps (semiconductor LEDs are more environmentally friendly and enable miniaturization, higher energy efficiency and portability, faster turn-on, and integration), among other potential applications. Additionally, the development of high power deep-UV LEDs is extremely important for applications such as high density optical data storage, bio-chemical identification, air and water purification, food sterilization, UV curing, fire detection, non-line-of-sight short range communications, solar blinds, and biomedical research.

In some embodiments, current crowding in LEDs is mitigated by using mesa geometries with small dimensions (e.g., 200 nm to 3000 nm, or from 750 nm to 3000 nm) compared to conventional devices. In some embodiments, the small mesas enable a uniform EHR despite high concentrations of defects in the semiconductor layers within the LED (e.g., grown group-III nitride films). Additionally, light emission of the LEDs is improved by forming mesas containing intrinsic regions with dimensions approximately equal to a small integer number of wavelengths of the light. The term "intrinsic region", as used herein, is a region that is unintentionally doped during formation. For example, in a PIN structure, the n-type and p-type layers can have doping densities from about $10^{17}$ cm$^{-3}$ to about $10^{20}$ cm$^{-3}$, and the intrinsic region (or layer) can have doping densities below about $10^{16}$ cm$^{-3}$, or from about $10^{14}$ cm$^{-3}$ to about $10^{16}$ cm$^{-3}$. In some examples of PIN structures, the intrinsic region has a doping density more than 1 order of magnitude below the surrounding n-type and/or p-type regions. For example, the diameters of cylindrical mesas, or mesa dimensions parallel to the substrate in rectangular prism shaped mesas (i.e., length and/or width), can be from about 1 to 10, or about 1 to 5, or up to about 5, or up to about 10 integer numbers of wavelengths of the light to be emitted by the LEDs. Light emitting devices with this geometry function differently from conventional light emitting devices because devices with this geometry advantageously confine the light emitted from the intrinsic region to a small number of transverse modes (e.g., from 1 to 10 transverse modes), which enhances light extraction compared to conventional devices with larger mesas. The term "mode", as used herein, refers to the possible standing electromagnetic waves in cavity. For example, the cavity can be formed between mirrors on the top and bottom of a semiconductor structure, or the cavity can be formed between the sidewalls within a mesa in a semiconductor structure. Light emission of such LEDs is further improved, in some embodiments, by forming the intrinsic region of the mesas with a layer-thickness that creates a resonate microcavity in the vertical direction. Deep-UV LEDs with resonant microcavities in the vertical direction are described more completely in U.S. Publication Number US 2017/0309779, the entirety of which is incorporated herein by reference. In such devices, the confined transverse optical modes within the volume of the device can optically couple to the vertical propagating modes, which further enhances light extraction.

The mesas in the deep-UV LEDs described herein can be any shape, including but not limited to cylinders, prisms, and truncated pyramids. The prisms and truncated pyramids can have any shapes as their bases, including but not limited to circles, ovals, triangles, squares, rectangles, hexagons, stripes, and other polygons. Throughout this disclosure, the lateral dimension (i.e., a dimension in a direction approximately parallel to the substrate of the device) of the mesas in deep-UV LEDs can be referred to as a width, a length, or a diameter, and these terms can be used interchangeably, because the geometry of the mesas is not limited in the deep-UV LEDs described herein.

Previous attempts to mitigate current crowding in LEDs include utilizing micronmesa geometries with mesa widths ranging from approximately 5 microns to tens of microns. This is perhaps because the calculated current spreading length $L_s$ over a mesa of an LED is typically in the range tens of microns due to the sheet resistivity of the n-type region, and the total vertical resistance of the device (including electrical contact layers and the p-type region).

However, due to high defect densities in group-III nitride films, the actual current spreading length $L_s$ is in the micron range, or less than 1 micron in some cases. Thus, small mesa geometries as disclosed herein provide an unexpected result of advantageously reducing current crowding compared to mesas with approximately 5 microns to tens of microns dimensions.

The effects of current crowding on EHR in the intrinsic region of example semiconductors is illustrated in FIG. 1A, which shows a simplified schematic of a side cross-section view and a top cross-section view of an LED 100 having an ideal first semiconductor structure 110 and a second semiconductor structure 120 (with each structure including a mesa). FIG. 1A is not drawn to scale, and features in FIG. 1A may be different sizes from one another, even if they appear not to be. By way of example, the ideal semiconductor structure 110 is shown to exhibit ideal current distribution, shown by the arrows 102 extending from the metal contact 111 evenly across the width of the mesa 114. Because of uniform current spreading, the ideal semiconductor structure 110 has a uniform EHR region 113 substantially commensurate with the lateral spatial extent of the topmost electrode 115. The semiconductor structure 120, which better represents a semiconductor structure that can be practically achieved, is shown to exhibit a non-uniform EHR region 123 due to current crowding, as shown by the arrows 103 extending from the contact 121 only partially across the width of the mesa. The ideal semiconductor structure 110 includes an n-type region 105, an n-type metal contact 111, the uniform EHR region 113 within a mesa 114, and a p-type metal contact (electrode) 115, among other elements not shown for simplicity. The mesa 114 contains an n-type region closest to the n-type region 105, an intrinsic region, and a p-type region closest to p-type metal contact (electrode) 115. In some embodiments, the n-type region 105 and the n-type region in the mesa 114 are formed from the same deposited semiconductor layer. The semiconductor structure 120 includes the n-type region 105, an n-type metal contact 121, the non-uniform EHR region 123 within a mesa 124, a p-type metal contact 125, among other elements not shown for simplicity. The mesa 124 contains an n-type region closest to the n-type region 105, an intrinsic region, and a p-type region closest to p-type metal contact (electrode) 125. In some embodiments, the n-type region 105 and the n-type region in the mesa 124 are formed from the same deposited semiconductor layer. Also shown is a cross-section indicator 116 (taken through the side cross-section view for the top cross-section view) and a cross-section indicator 117 (taken through the top cross-section view for the side cross-section view) of the ideal semiconductor structure 110 and semiconductor structure 120. The cross-section indicators 116 and 117 include arrows which define the direction of viewing after the cross-section is taken. For example, cross-section indicator 116 has arrows point down towards the n-type region 105 in the side cross-section view. The downward facing arrows on cross-section indicator 116 indicate that the top cross-section view is the view of the LED 100 looking down after the cross-section is taken at cross-section indicator 116. As a result, the top cross-section view includes the n-type metal contact 111, for example. As shown, the non-uniform EHR region 123 of the semiconductor structure 120 occurs along the perimeter of the intrinsic region within mesa 124, and does not occur in the inner-area of the intrinsic region within mesa 124. This is contrasted by the uniform EHR region 113 of the ideal semiconductor structure 110, which occurs throughout the intrinsic region within mesa 114.

The ideal structure 110 has uniform EHR region 113 because the current spreading length ($L_s$) is equal to or greater than approximately half the mesa dimension in a direction parallel to the substrate. Not to be limited by theory, the current spreading length ($L_s$) is mainly the result of the lateral, vertical and contact resistances in the LED device, and as such is the average distance that a majority carrier travels in the semiconductor (e.g., the average distance an electron travels in the n-type region 105 in FIG. 1A) beneath the contact (e.g., 111 or 121 in FIG. 1A) before it flows up into the intrinsic region (e.g., the intrinsic region in mesa 114 and 124 in FIG. 1A) where recombination and light emission occur. The relatively long $L_s$ in the ideal structure 110 allows carriers to be injected uniformly into the intrinsic region within mesa 114 from the ring-shaped n-type metal contact 111. In contrast, structure 120 has non-uniform EHR region 123 in the shape of an annulus because the current spreading length ($L_s$) is smaller than approximately half the mesa dimension in a direction parallel to the substrate. In this case, the short $L_s$ only allows the carriers to be injected partially across the width of the intrinsic region within mesa 124 from the ring-shaped n-type metal contact 121, and annulus shaped EHR region 123 has an annulus width approximately equal to $L_s$.

Depending on various characteristics of the ideal semiconductor structure 110 or semiconductor structure 120 (e.g., defect density in grown group-III nitride films, resistance of the p-type and n-type regions, and electron-hole mobility), the area of EHR may not scale in proportion to total mesa area and instead may scale in proportion to mesa width. This problem is illustrated using simplified plots 200 of FIG. 2, which show area of EHR (e.g. within an intrinsic region) as a function of mesa length $L_x$ for simplified semiconductor structures of varying mesa width.

The optical spatial modes within LEDs and microcavity LEDs propagate in different spatial directions. These so called optical spatial modes are of the form of longitudinal and transverse optical modes which are an inherent property of the device material and physical dimensions. Some modes, such as higher order modes, can propagate in directions which do not contribute to the useful emission from an LED. For example, light with a particular spatial mode can propagate in a direction where the light will be trapped within the device due to total internal reflection. In another example, light with a particular a spatial mode can be emitted from the device at a disadvantageous angle (e.g., an angle that causes the light to be trapped within the LED package). Yet another spatial mode can propagate from within the device interior where it is generated into directions that exit the device to form advantageous optical power coupling to a particular application. Alternatively, in some embodiments, advantageous out coupled light from the LED device is formed into a beam with low angular spread that can be readily collimated or focused. The dimensions of the layers forming the mesa (e.g., the intrinsic layer) and the current spreading lengths that result from the electrical properties determine what spatial modes of light can exist within the LED. FIGS. 1B-1G show examples of the spatial modes that can exist within LEDs with different dimensions and current spreading lengths.

Figure 1B:
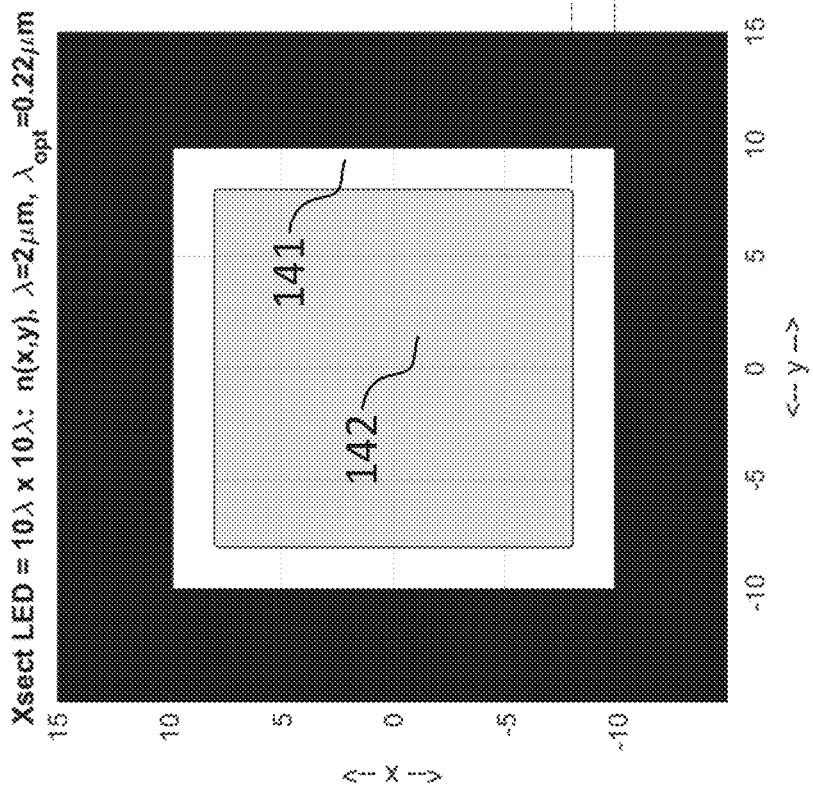
FIG. 1B shows a simplified schematic in plan view of two example LED semiconductor structures, in accordance with some embodiments.
Figure 1B:
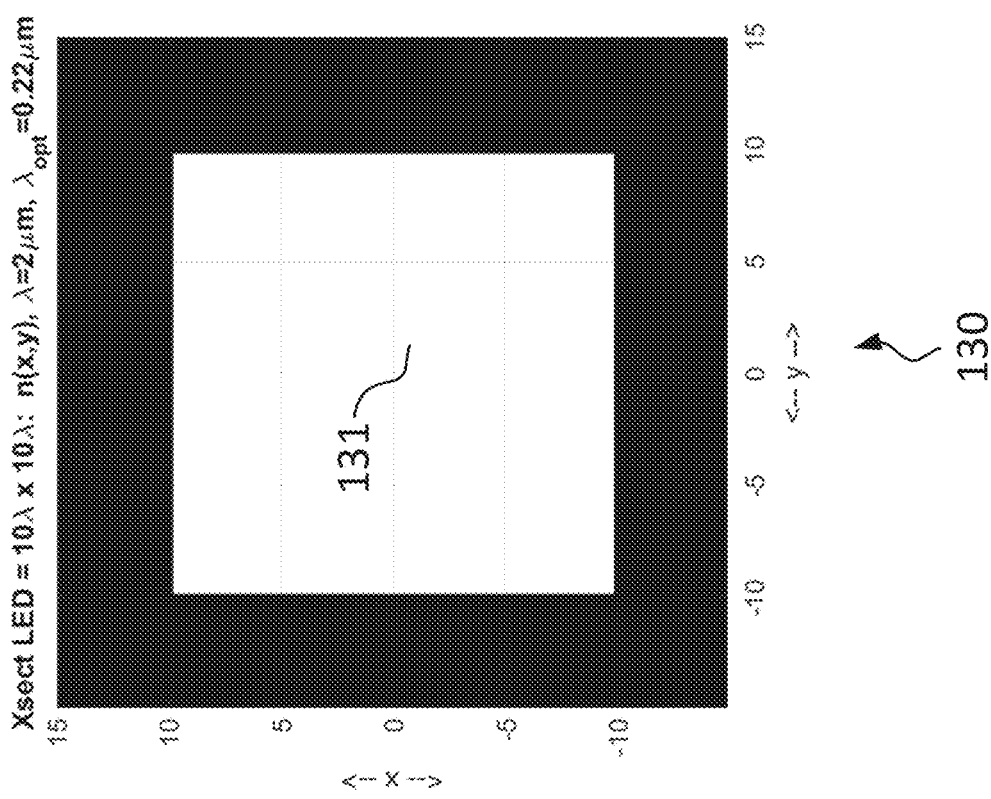

FIG. 1B shows examples of simplified schematics in plan view of two LED semiconductor structures with mesa dimensions of 20 microns by 20 microns, surrounded by air. The wavelength of the emitted light from both of the structures 130 and 140 is 220 nm. Semiconductor structure 130 has uniform current injection and a uniform EHR, and semiconductor structure 140 has a non-uniform EHR due to a current spreading length of 2 microns. Region 131 within semiconductor structure 130 is the uniform EHR region, which extends uniformly across the entire mesa area. Region 141 is the annular EHR region within semiconductor structure 140, and region 142 has no EHR and therefore does not contribute to the emitted light from the structure. By way of example, the material structure is constructed such that light generated due to the advantageous injected electrons and holes results in substantially monochromatic emission wavelength due to direct recombination of the said electron and holes within the intrinsic region. If the device layers are further constructed to operate as a microcavity, for example by having at least one high reflector, then the device will have longitudinal optical modes substantially perpendicular to the plane of the layers. These longitudinal optical modes in general determine the emission wavelength from the device. The plan view structure of the device as shown in FIG. 1B further have lateral dimensions which influence the transverse optical modes supported by the given geometry. A symmetric square lateral LED geometry is shown in FIG. 1B, however, other geometries are also possible, for example, rectangular and circular. Mesas with square geometries can be readily packed into a high density of smaller LEDs forming an array in accordance with some embodiments.

Figure 1C:
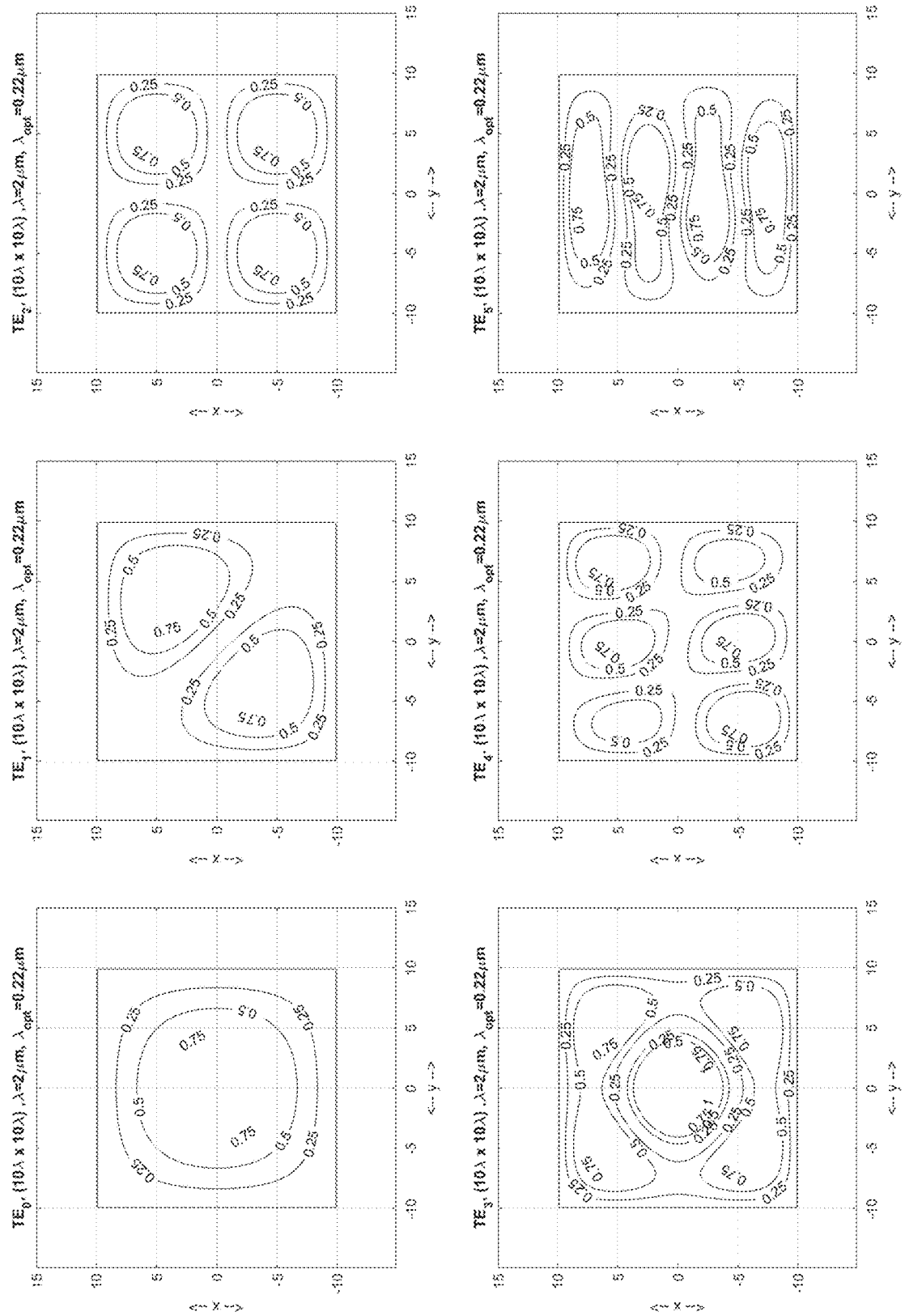
FIGS. 1C-1D show examples of different plan view contour charts that plot the light intensity for different transverse modes within the semiconductor structures in FIG. 1B, in accordance with some embodiments.

FIG. 1C shows examples of 6 different plan view contour charts that plot the light intensity for different transverse modes (i.e., $TE_0$, $TE_1$, $TE_2$, $TE_3$, $TE_4$ and $TE_5$) within the semiconductor structure 130. The black surrounding area represents the lateral cladding materials which can be air, dielectric or reflective metal. The light intensity in the different transverse modes are relatively uniform across the area of the mesa due to the uniform EHR within region 131. These modes represent the possible beam shapes supported by the device at the operating wavelength, which in this particular case is 220 nm. In general, if uniform electron-hole recombination occurs across the full lateral extent of 131, then the dominant transverse mode will be selected from at least $TE_0$, $TE_1$, $TE_2$, $TE_3$, $TE_4$ and $TE_5$ and will typically be the mode or modes with the largest emission area.

Figure 1D:
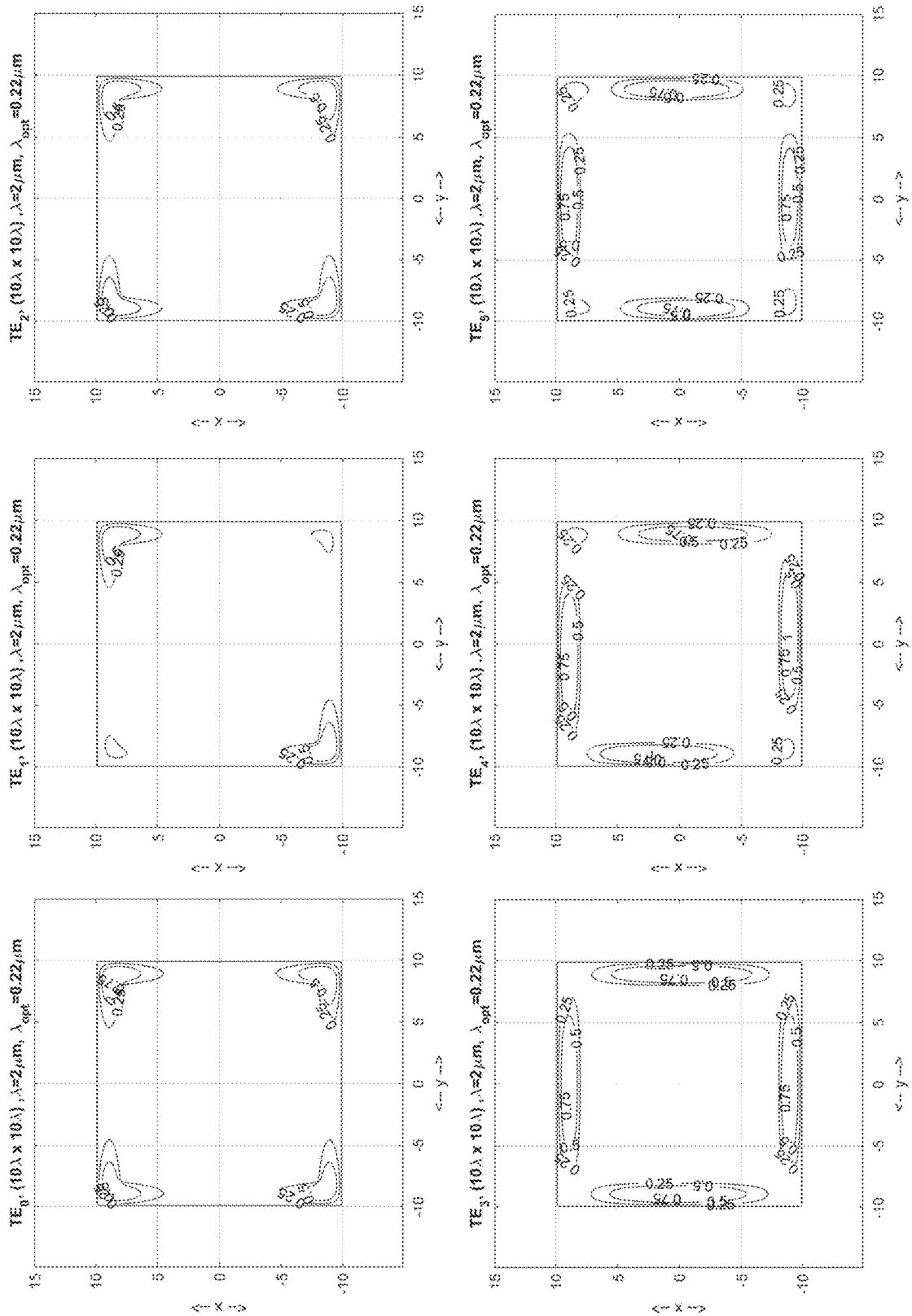

In contrast, FIG. 1D shows examples of 6 different plan view contour charts that plot the light intensity for different transverse modes (i.e., $TE_0$, $TE_1$, $TE_2$, $TE_3$, $TE_4$ and $TE_5$) within the semiconductor structure 140, which has a short current spreading length compared to the mesa dimensions. The light intensity in the different transverse modes are non-uniform across the area of the mesa and are concentrated in the region 141, where the EHR occurs. Due to the light being preferentially generated at the periphery of the device and at the corners the amount of light output from semiconductor structure 140 is less than the amount of light output from semiconductor structure 130. The effect of current crowding therefore reduces the possible light output power from the LED by restricting the EHR to regions near the periphery of the mesa edges. Furthermore, the transverse modes supported are not advantageous for efficient optical extraction and or coupling outside of the device.

FIG. 1E shows examples of simplified schematics in plan view of two LED semiconductor structures with mesa dimensions of 5 microns by 5 microns, surrounded by air. The wavelength of the emitted light from both of the structures 150 and 160 is 220 nm. Semiconductor structure 150 has uniform current injection and a uniform EHR, and semiconductor structure 160 has a non-uniform EHR due to a current spreading length of 2 microns. Region 151 within semiconductor structure 150 is the uniform EHR region, which extends uniformly across the entire mesa area. Region 161 is the annular EHR region within semiconductor structure 160 restricted by current crowding, while region 162 has no EHR and therefore does not contribute to the emitted light from the structure. Semiconductor structure 160 has smaller mesa dimensions than semiconductor structure 140, and therefore the deleterious effects of the 2 micron current spreading length are somewhat reduced. As the current spreading length decreases even further, the mesa dimensions can be decreased below 5 microns (e.g., 200 nm to 3000 nm, or from 750 nm to 3000 nm) to provide uniform EHR, and confine the light emitted from the intrinsic region to a small number of transverse modes. The 5 micron dimensions (i.e., more than 20 times the target wavelength 220 nm) of the mesas in this example are too large to significantly limit the number of allowed transverse optical modes within the structures.

Figure 1F:
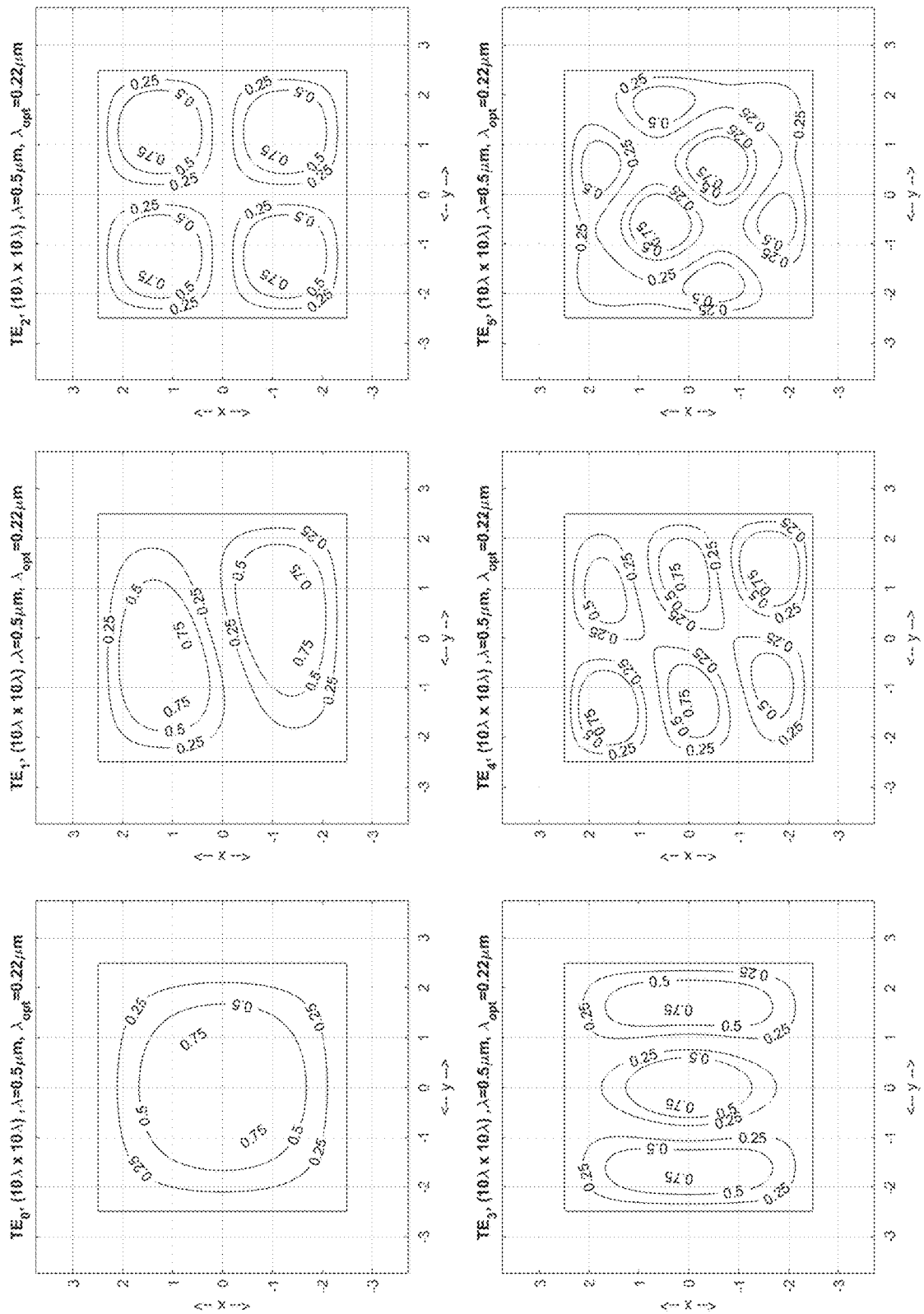
FIGS. 1F-1G show examples of different plan view contour charts that plot the light intensity for different transverse modes within the semiconductor structures in FIG. 1E, in accordance with some embodiments.

FIG. 1F shows examples of 6 different plan view contour charts that plot the light intensity for different transverse modes (i.e., $TE_0$, $TE_1$, $TE_2$, $TE_3$, $TE_4$ and $TE_5$) within the semiconductor structure 150. The light intensity in the different transverse modes are relatively uniform across the area of the mesa due to the uniform EHR within region 151.

Figure 1G:
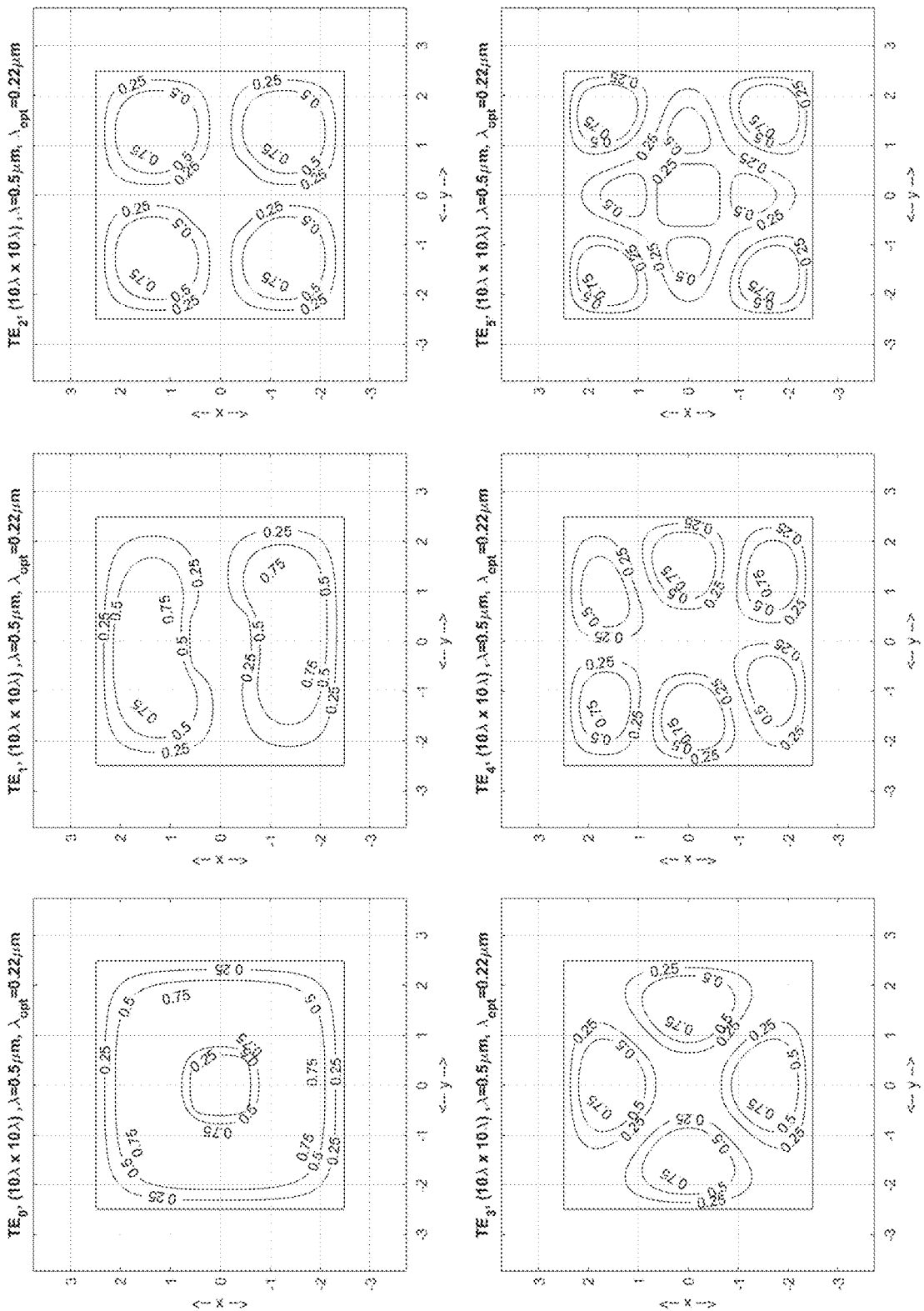

In contrast, FIG. 1G shows examples of 6 different plan view contour charts that plot the light intensity for different transverse modes (i.e., $TE_0$, $TE_1$, $TE_2$, $TE_3$, $TE_4$ and $TE_5$) within the semiconductor structure 160. The light intensity in the different transverse modes are non-uniform across the area of the mesa and are concentrated in the region 161, where the EHR occurs. Due to the light being preferentially generated at the periphery of the device and at the corners the amount of light output from semiconductor structure 160 is less than the amount of light output from semiconductor structure 150. However, the percentage of area that is capable of out coupling light from the device is similar for device 150 and 160. Clearly, for a given material technology resulting in a given current spreading length, the limitation can be overcome by reducing the device lateral dimensions sufficiently to recover the transverse modes advantageous for light emission. Furthermore, a plurality of such reduced lateral dimension LEDs can be fabricated into a two dimensional array having cumulative light out substantially higher than a single device of the same effective area, which is severely limited by current crowding (i.e., having a small current spreading length compared to the mesa lateral dimensions).

Figure 2:
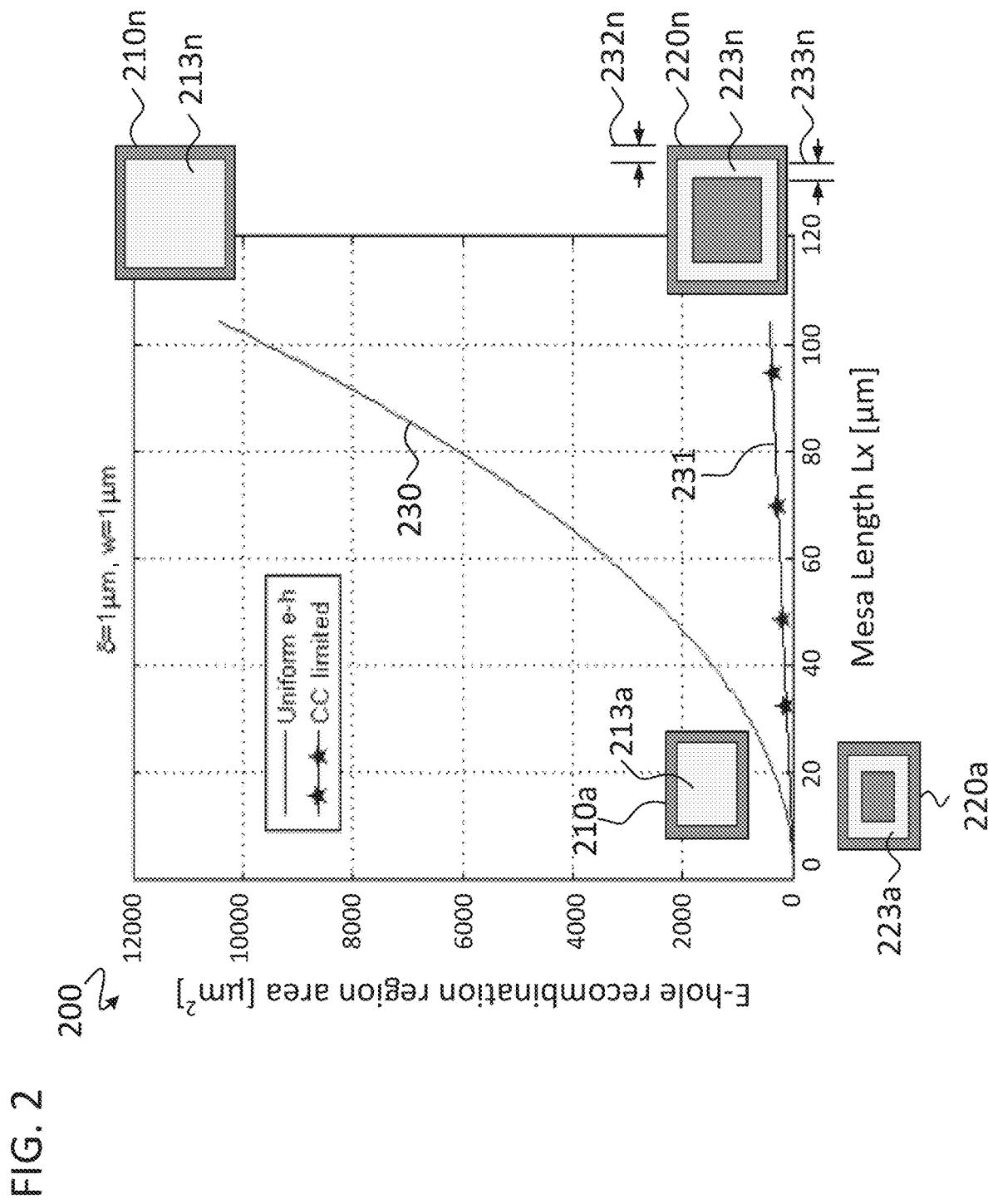
FIG. 2 is a simplified plot of electron-hole recombination (EHR) area as a function of mesa length, in accordance with some embodiments.

FIG. 2 includes: schematic views of simplified semiconductor structures 210a-n having EHR regions 213a-n; schematic views of simplified semiconductor structures 220a-n having EHR regions 223a-n; a first plotted line 230; a second plotted line 231; a setback length (δ) 232n; and a current crowded EHR region width (w) 233n. The current crowded EHR region width (w) 233n is equal to the current spreading length ($L_s$). The setback length (δ) 232n, and the current crowded EHR region width (w) 233n are 1 micron for the data plotted in lines 230 and 231. The simplified semiconductor structures 210a-n approaches the ideal semiconductor structure 110 with long $L_s$ compared to the mesa dimensions, and the simplified semiconductor structures 220a-n are similar to the semiconductor structure 120 with short $L_s$ compared to mesa dimensions. Plotted lines 230 and 231 show area of EHR as a function of mesa length $L_x$ of the semiconductor structures 210a-n and 220a-n, respectively. For simplicity, mesa dimension is illustrated as a square shape having equal length sides of length $L_x$. Other shapes are also possible. For an intrinsic region area given by $L_x^2$ (e.g. the mesa width is equal to the mesa length), an annulus shaped current crowded region (e.g., the electron hole recombination region 223n) begins at the setback length (δ) 232n from the mesa edge and has a width shown as the current crowded EHR region width (w) 233n. The current crowded EHR region width 233n indicates the poor lateral penetration into the interior of the device. The plotted line 230 corresponds to a semiconductor structures (210a-n) having uniform EHR, and the plotted line 231 corresponds to a semiconductor structures (220a-n) having non-uniform electron hole recombination. As shown, in plot 230 EHR region area increases in proportion to the square of mesa length $L_x$ (e.g., proportional to mesa area), while in plot 231 EHR region area scales nearly linearly with mesa length $L_x$ (e.g., proportional to mesa perimeter). The area of the EHR region is directly proportional to the spontaneous emission intensity, and therefore the relationships shown in plotted lines 230 and 231 are similar to the relationships between spontaneous emission intensity and mesa length Lx in structures 210a-n and 220a-n respectively. Additionally, because the area of the electron-hole recombination region is directly proportional to spontaneous emission intensity, mesa area scaling can be used to quantify the effect of current crowding. As shown by plotted line 230, uniform EHR is advantageous for device performance, and enables spontaneous emission intensity per unit area to increase substantially as mesa area increases. In contrast, as shown by plotted line 231, non-uniform EHR due to current crowding is characterized by disadvantageous scaling of EHR region area and spontaneous emission intensity as mesa area increases. In other words, plot 200 compares devices with current crowding limited EHR regions to devices with uniform EHR regions, and highlights the advantages of reducing the mesa size to near or below half the current spreading length $L_s$ to achieve uniform EHR, and large EHR region area compared to mesa length $L_x$.

Figure 3:
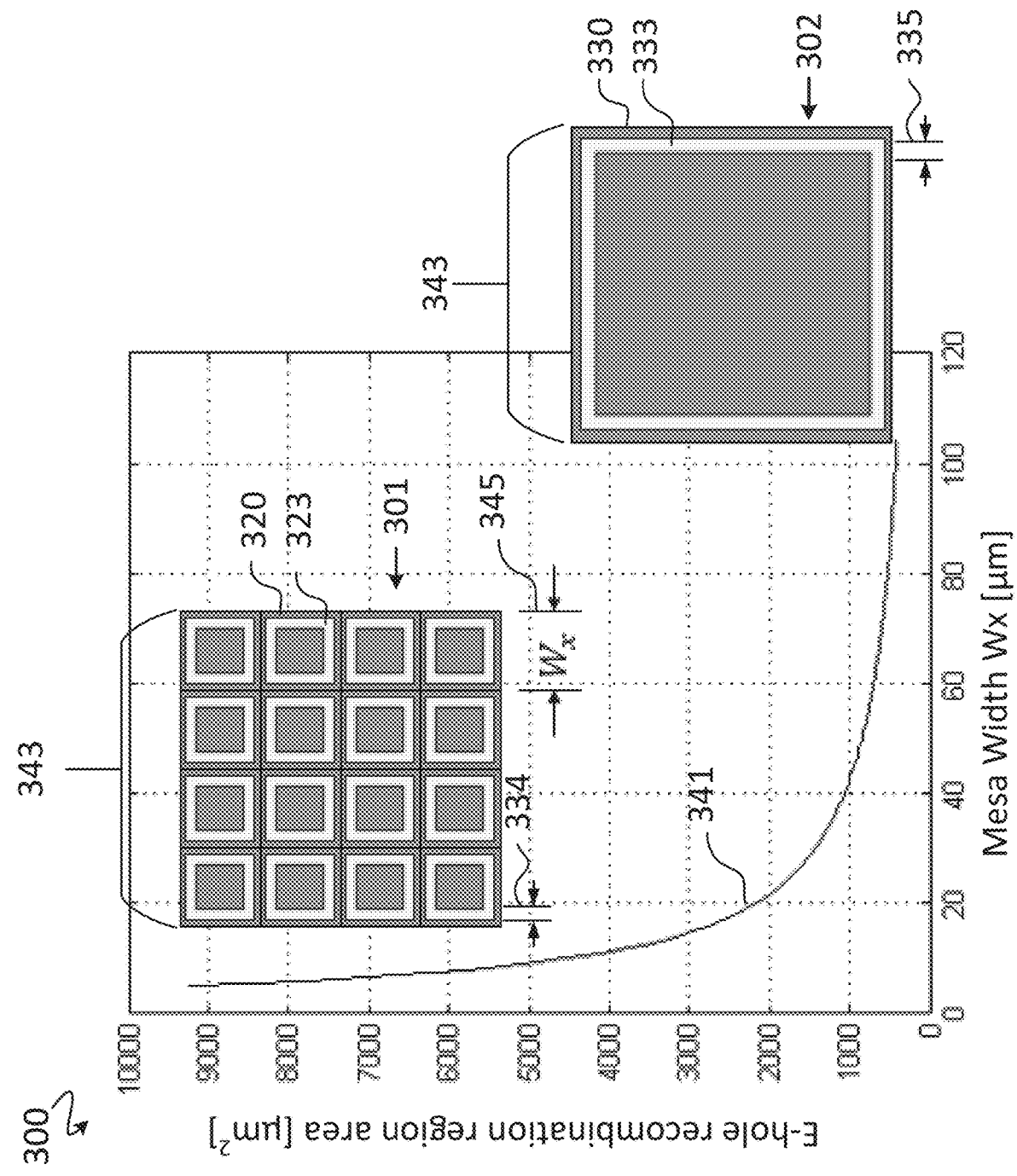
FIG. 3 is a simplified plot of EHR area as a function of mesa width, in accordance with some embodiments.

FIG. 3 shows a simplified plot 300 having a plotted line 341 which corresponds to the area of the EHR region as a function of a square mesa width $W_x$ in semiconductor structures having non-uniform EHR. FIG. 3 includes: a first schematic view of a simplified semiconductor superstructure 301 (e.g., a die); a second schematic view of a simplified semiconductor superstructure 302; a first semiconductor structure 320; a first EHR region 323; a second semiconductor structure 330; a second EHR region 333; a first current crowded region width 334; a second current crowded region width 335; the plotted line 341; a semiconductor superstructure width 343; and a first semiconductor structure width 345 ($W_x$).

As shown, within the semiconductor superstructure width 343, the semiconductor superstructure 301 includes 16 semiconductor structures 320. Each of the 16 semiconductor structures 320 has a (current crowded) EHR region 323, each has a mesa width $W_x$ equal to the first semiconductor structure width 345, and each is similar to the semiconductor structure 120 of FIG. 1A. By contrast, within the same semiconductor superstructure width 343, the simplified semiconductor structure 302 includes only the single semiconductor structure 330 that has a mesa width $W_x$ (not shown) which is equal to the semiconductor superstructure width 343.

As was illustrated with respect to FIG. 1A and FIG. 2, due to current crowding, the area of EHR occurs substantially in a current crowded, annular shaped, region confined to the perimeter of the intrinsic region of the mesa, which is due to the path of least resistance for charge carriers. As shown in FIG. 3, the current crowded region is confined to a rectangular annulus of the EHR region 323 or 333 and the remaining interior portion of the active area is devoid of advantageous carrier recombination. This annular shaped EHR region is a direct consequence of the short $L_s$ (compared to mesa width), which is due to the lateral and vertical resistances for the devices depicted schematically in FIG. 1.

Referring again to the semiconductor superstructures of FIG. 3, as the mesa width $W_x$ 345 increases, the current crowded region annular width (e.g., the second current crowded region width 335) remains substantially constant and the EHR region 333 only increases roughly linearly with the increase in the length/width of the semiconductor superstructure 302. Because the current crowded region width remains substantially constant, if the single large mesa is partitioned into a plurality of smaller mesa regions, as shown by the semiconductor superstructure 301, then each of the semiconductor structures 320 will have a current crowded region of the first current crowded region width 334 which is substantially the same as the second current crowded region width 335.

For a given amount of area consumed on a wafer defining a die, the area of the current crowded region can be optimized by partitioning the die into a plurality of smaller mesa regions as compared to the use of only a single large mesa on the die. That is, multiple smaller semiconductor structures can be optimized to fit within the same semiconductor superstructure width 343 and thus the area defining the EHR regions can be maximized. Simplified plot 300 depicts the EHR region area versus the mesa width in the case where a die is partitioned into a plurality of smaller mesa regions. As shown by the plotted line 341, as mesa width $W_x$ decreases, multiple semiconductor structures can populate the same area as a single semiconductor structure. The die size for the data plotted in FIG. 3 is fixed at approximately 100 microns, and the number of mesas included in the die increases as the mesa width decreases. The data plotted by line 341, therefore, is a simplified approximation that does not take into account that there could be partial mesas within the die. As a result, the total area of the EHR regions is maximized, even when impacted by current crowding. Accordingly, light emission of a semiconductor superstructure 301 having multiple semiconductor structures 320 may exhibit higher light emission as compared to a semiconductor superstructure 302, of the same width 343, having a single semiconductor structure 330 and limited by the same current crowding effect.

In some embodiments, a die is partitioned into a plurality of mesa regions, and the mesa width $W_x$ is less than half the current spreading length $L_s$. It has been discovered that, by forming mesas with lateral dimensions equal to a small number of wavelengths of the emitted light, the lateral dimensions are less than half the current spreading length $L_s$, and the EHR region is substantially uniform across the area of the mesa, and does not have an annular shape.

As was shown in FIGS. 2 and 3, a signature of current crowding is that output power of a light-emitting device often scales with the perimeter of the light emitting semiconductor structure rather than the area of the semiconductor structure. Greater current crowding (or lower current spreading) is generally caused by higher defect density in grown III-Nitride films, higher resistivity of n-type or p-type layers, and/or lower electron and hole carrier mobility. Due to the high defect densities in typical grown III-Nitride film, and due to the challenge to form high conductivity n-type and p-type films in deep-UV LEDs, the actual current spreading length $L_s$ is in the range of approximately 400 nm to 5 microns. Additionally, small mesas will contain fewer total defects, which can be beneficial to device performance. For example, an LED with an area of 1 cm$^2$ can contain approximately 10$^{10}$ defects in the III-Nitride films contained therein. LEDs with similar defect densities in the III-Nitride films with 100 times smaller areas (i.e., areas of 1 mm²) would contain approximately $10^8$ defects, while LEDs having small mesa widths of 500 nm would only contain approximately 25 defects.

Therefore, in some embodiments, the light emitting region of the mesa is advantageously formed to have a width that is 200 nm to 3000 nm, or from 750 nm to 3000 nm. This scale of mesa width can provide uniform current pumping (i.e., spreading) across the active area of the light emitting device, because the mesa width can be less than about twice the current spreading length $L_s$. Additionally, as was discussed with respect to FIG. 3, by including multiple mesas within a given die (i.e., within a semiconductor superstructure) area, the total mesa perimeter is several times longer than a die that includes only a single mesa, thus total light output power is increased over a device with one large mesa filling the die area (even if the EHR region is annular shaped, and not substantially uniform).

Figure 4:
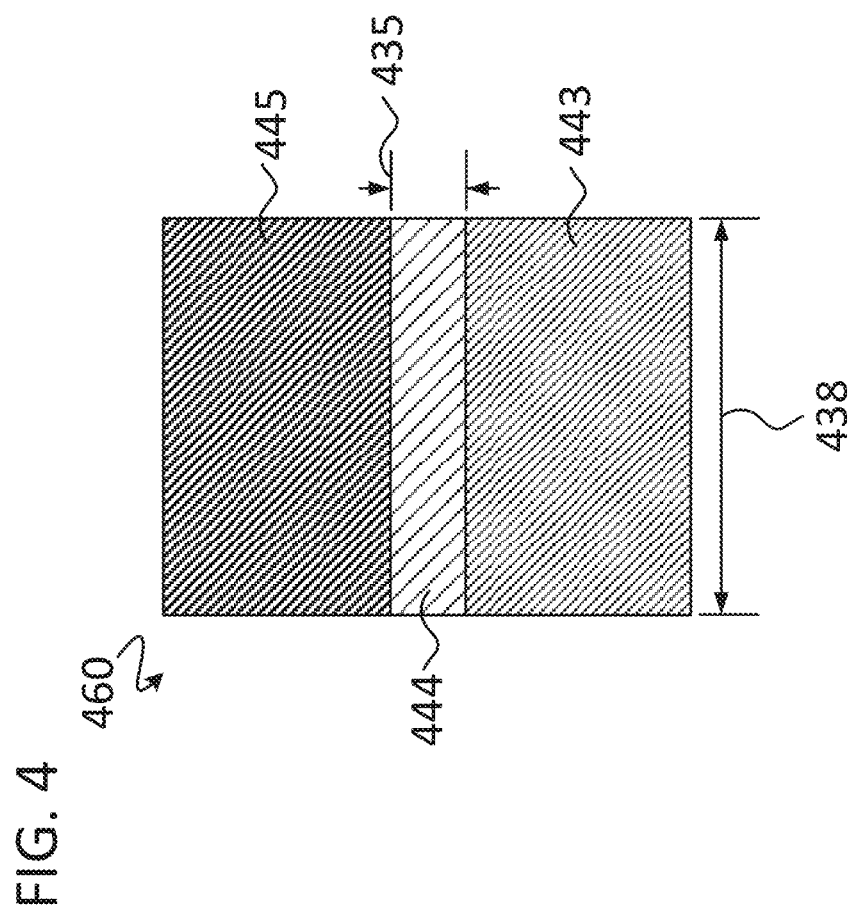
FIG. 4 is a simplified schematic view of a portion of a deep-UV LED semiconductor structure, in accordance with an example embodiment.

FIG. 4 illustrates a simplified schematic of an embodiment of a portion of a deep-UV LED semiconductor structure 460 (i.e., a mesa). Dimensions of the semiconductor structure 460 shown include a mesa width 438 and an intrinsic region height/thickness 435. The semiconductor structure 460 includes a first active layer 443, a light emitting region 444 (e.g., an intrinsic region), and a second active layer 445. In some embodiments, the first active layer 443 is an n-type region, the light emitting region 444 is an intrinsic region, the second active layer 445 is a p-type region, together forming a PIN device. In such embodiments, the first active layer 443 provides n-type conductivity, the second active layer 445 provides p-type conductivity, and electrons and holes recombine within the light emitting region 444 to emit light.

In some embodiments, the first active layer 443 includes: Si doped n-GaN, n-AlGaN, n-type short-period superlattice (n-SPSL, e.g., containing AlN/GaN, or $Al_xGa_{1-x}N/Al_yGa_{1-y}N$, where x is from 0 to 1, and y is from 0 to 1), or n-AlN. In some embodiments, the light emitting region 444 includes: intrinsic SPSL (e.g., AlN/GaN, or $Al_xGa_{1-x}N/Al_yGa_{1-y}N$, where x is from 0 to 1, and y is from 0 to 1); multiple, or single, quantum wells (e.g., $Al_xGa_{1-x}N/Al_yGa_{1-y}N$, where x is from 0 to 1, and y is from 0 to 1); or intrinsic AlN. In some embodiments, the second active layer 445 includes: Mg doped p-GaN, p-AlGaN, p-type short-period superlattice (p-SPSL, e.g., AlN/GaN, or $Al_xGa_{1-x}N/Al_yGa_{1-y}N$, where x is from 0 to 1, and y is from 0 to 1), or p-AlN. In other embodiments, the first active layer 443 includes n-doped ZnO, MgO or BN; the light emitting region 444 includes one or more of intrinsic ZnO, MgO, or BN based emitting layers (e.g., containing quantum wells); and the second active layer 445 includes one or more of p-type doped wide band gap semiconductor materials p-ZnO, p-MgO, p-BN or its bilayer structures.

In some embodiments, the first active layer 443 has a thickness of 400 nm, or from 50 nm to 10000 nm, and is formed as an SPSL. In some embodiments, the SPSL of layer 443 has a ratio of 1 monolayer (ML) GaN to 4 ML AlN, or of 1 ML GaN to from 1 to 10 ML of AlN, or of 0.2 ML GaN to from 0.2 to 10 ML of AlN. In some embodiments, the light emitting region 444 has a thickness of 50 nm, or from 10 nm to 100 nm, or from 1 nm to 500 nm, and is formed as an SPSL. In some embodiments, the SPSL of layer 444 has a ratio of 1 ML GaN to 4 ML AlN, or of 1 ML GaN to from 1 to 10 ML of AlN, or of 0.2 ML GaN to from 0.2 to 10 ML of AlN. In some embodiments, the second active layer 445 has a thickness of 190 nm, or from 5 nm to 1000 nm and is formed as an SPSL, or a combination of an SPSL and another layer (e.g., an SPSL and a layer of p-type GaN). In some embodiments, the SPSL of layer 445 has a ratio of 2 ML GaN to 2 ML AlN, or of 2 ML GaN to from 2 to 10 ML of AlN, or of 0.2 ML GaN to from 0.2 to 10 ML of AlN. In some embodiments, an electron blocking region (not shown) having a thickness of 50 nm, or from 10 nm to 500 nm, is formed between the light emitting region 444 and the second active layer 445. In some embodiments, the electron blocking region is formed as a chirp layer with an SPSL having a gradient in the ratio of monolayers. For example, the gradient can begin with thicker AlN barriers (e.g., with a ratio of 10 ML AlN to 0.2 ML GaN) adjacent the light emitting region 444 and end with thinner AlN barriers (e.g., with a ratio of 0.2 ML AlN to 2 ML GaN) adjacent the second active layer 445) by changing the AlN and GaN fractions. For example, the total effective Al composition can be changed from high to low within the chirp layer by starting with 10 ML layer of AlN and a 0.2 ML layer of GaN (which is almost Al 100%) and ending the chirp layer with a 10 ML layer of GaN and a 0.2 ML layer of AlN (which is almost 0% Al). Not to be limited by theory, this type of a chirp layer including a gradient formed by an SPSL with different thickness layers throughout can be beneficial for generating polarization doping, and improving hole transport. In other examples, different wide band gap and narrow band gap materials are used in the electron blocking region chirp layer (e.g., with a gradient in bandgap of the barriers and/or wells within the chirped SPSL).

In some embodiments, the mesa width 438 is approximately equal to the target wavelength of light emitted from the intrinsic region 444, or is approximately equal to an integer number of target wavelengths of the light emitted from the intrinsic region 444. As a result, light emitted from the light emitting region 444 is confined to a single, a quasi-single, or a small number of transverse modes. In some embodiments, the target wavelength of light emitted from the light emitting region 444 is about 265 nm and the mesa width 438, accordingly, is about 265 nm, or 530 nm, or 795 nm, or 1060 nm, or 1325 nm, or 1590 nm, or 1855 nm, or 2120 nm, or 2385 nm, or 2650 nm, or from about 250 nm to about 3000 nm, or from about 750 nm to about 3000 nm. In other embodiments, the target wavelength of light emitted from the light emitting region 444 is from about 200 nm to about 300 nm, and the mesa width 438 is correspondingly from about 200 nm to about 300 nm, or an integer multiple of a length from about 200 nm or about 300 nm where the integer multiplier is from 1 to 10 (e.g., 200 nm, or 400 nm, etc.; 250 nm, or 500 nm, etc.; or, 300 nm, or 600 nm, etc.), or from about 200 nm to about 3000 nm, or from about 500 nm to about 3000 nm, or from about 750 nm to about 3000 nm. In some embodiments, the mesa width is a multiple, up to 4, or up to 10, of the target wavelength.

In some embodiments, the mesa is surrounded by a reflector to improve amount of confinement of the transverse modes of the generated light. In some embodiments, the reflector comprises metal, such as Al. In some embodiments, the periphery of the mesa is (e.g., the exposed intrinsic region at the edge of the mesa) is protected by a passivation (e.g., dielectric) layer to protect the mesa from the reflector material. For example, a dielectric passivation layer can be deposited on the exposed mesa edges to prevent the semiconductor structure from being shorted by the reflector metal (e.g., Al). In other embodiments, an air gap can be included between the edge of the mesa and the reflector material.

In some embodiments, the light emitting region 444 is formed to have an intrinsic region height (i.e., thickness) 435 sufficient to form a microcavity, thus increasing vertical emission of light by the light emitting region 444. Cavity based vertical emission LEDs produce TE modes of mixed $E_x$ and $E_z$ polarization. These allowed optical modes within the device are therefore controlled to minimize the coupling to vertical propagating modes. As the disclosed deep-UV LED confines light to a single mode, quasi-single mode, or small number of modes, and the higher order modes, which are considered to be parasitic, are advantageously eliminated. By reducing the number of the parasitic modes at a given semiconductor structure, the highest light extraction efficiency is possible. In some embodiments, the number of optical modes that emitted light is confined to is less than 2. In some embodiments, the number of optical modes that emitted light is confined to ranges from 1 to 1.5. In some embodiments, the number of optical modes that emitted light is confined to is less than 5, or less than 10.

To further improve light extraction, in some embodiments, the microcavity described above is formed with a top optical reflector on the top of the semiconductor structure and a bottom optical reflector on the bottom of the semiconductor structure. In some embodiments, a third set of optical reflectors is also included on the mesa sidewalls. In some embodiments, a layer of Al metal is used as a top optical reflector and a distributed Bragg reflector (DBR) (e.g., a strained-layer superlattice (SLS) DBR, e.g., containing AlN/GaN) is used as a "leaky" bottom optical reflector to allow light to escape through the bottom of the structure.

In some embodiments, the LED with optical reflectors on the top and bottom of the semiconductor structure is a laser with the light emission through the substrate, or out of the exposed surface of the mesa (e.g., a vertical cavity surface emitting laser (VCSEL)). In some embodiments, the laser (e.g., VCSEL) contains one or more mesas containing intrinsic regions with lateral dimensions (e.g., width, length, or diameter) approximately equal to a small integer number of wavelengths of the emitted light, thereby confining the emitted light to a single, a quasi-single, or a small number of transverse modes.

Figure 5:
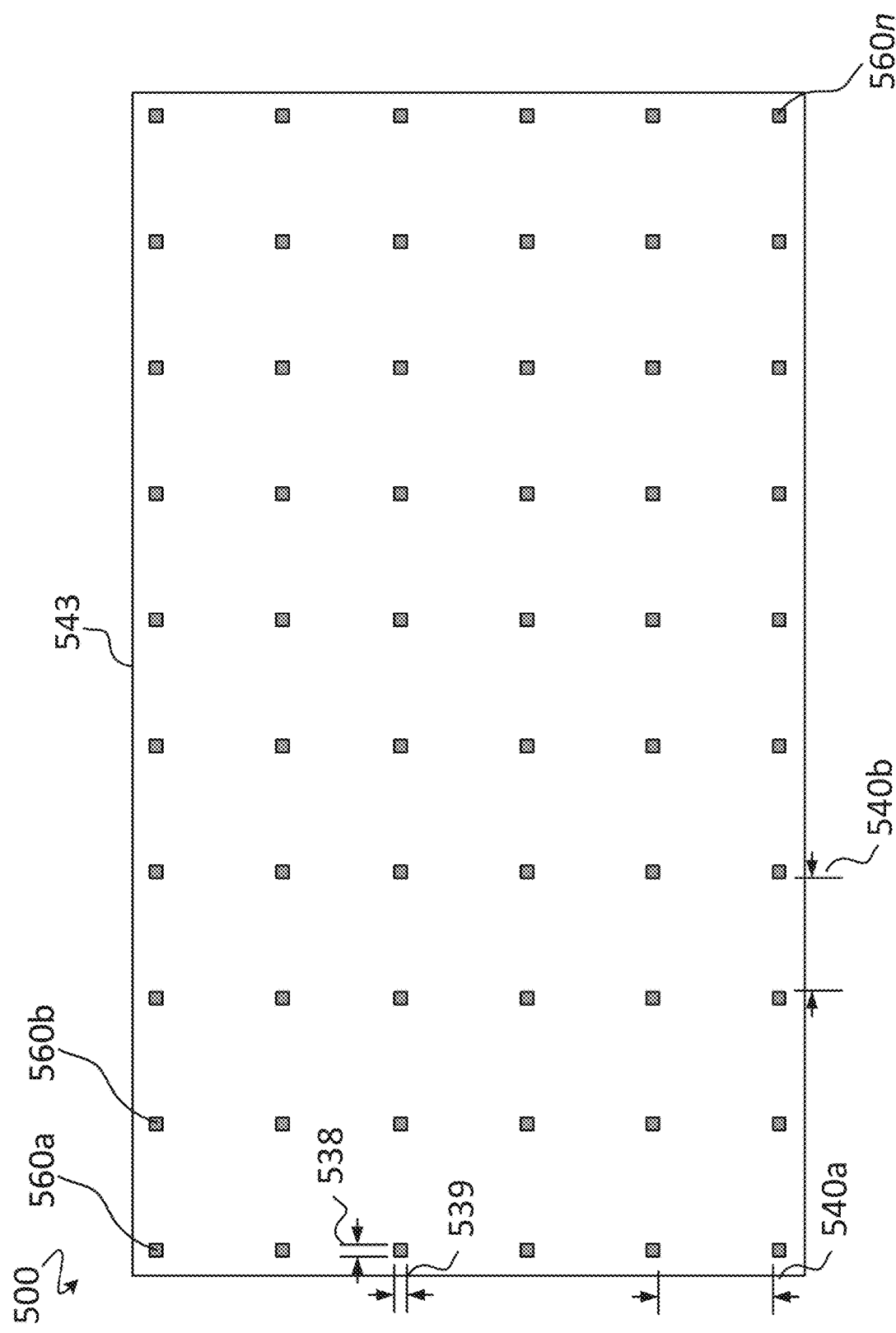
FIG. 5 is a simplified plan view schematic view of a semiconductor structure incorporating the simplified portion of a deep-UV LED of FIG. 4, in accordance with an example embodiment.

As was discussed with respect to FIG. 3, a device (e.g., semiconductor superstructure 301) that includes multiple mesas (e.g., semiconductor structures 320) within a given area exhibits greater total EHR than a device (e.g., semiconductor superstructure 302) having a single mesa of the same area. FIG. 5 shows a simplified example of an array of mesas 560a-n of a light emitting device 500. Each of the mesas 560a-n is similar to the semiconductor structure 460 of FIG. 4. The light emitting device 500 includes an indicator for a mesa width 538; an indicator for a mesa length 539; an indicator for a first mesa separation 540a; an indicator for a second mesa separation 540b; a first active layer 543; and mesas 560a-n. The first active layer 543 is similar to the first active layer 443 of FIG. 4 and is between, under, and part of each of the mesas 560a-n. Each of the mesas 560a-n has the mesa width 538 and the mesa length 539. Additionally, each of the mesas 560a-n is separated by the first mesa separation 540a, which is the distance from the edge of one mesa to the edge of an adjacent mesa in one direction along device, and by the second mesa separation 540b, which is the distance from the edge of one mesa to the edge of an adjacent mesa in a second direction along the device. In some embodiments, such as for the example shown in FIG. 5, the separation distance direction for separation distance 540a and the separation distance direction for separation distance 540b are perpendicular to one another. In other embodiments, the separation distance directions can be rotated from one another by angles that are not 90 degrees. For example, in the case of hexagonal prism shaped mesas the separation distance directions can be rotated from each other by angles of 60 degrees. Furthermore, in some embodiments, there can be more than 2 separation distances along more than 2 separation distance directions. For instance, in the case of hexagonal prisms there can be 3 separation distances defined along 3 separation distance directions each of which are rotated by 60 degrees from the adjacent separation distance direction.

The first mesa separation 540a can be the same or different than the second mesa separation 540b. In some embodiments, the first mesa separation 540a and/or the second mesa separation 540b is about 2 microns. In other embodiments, the first mesa separation and/or the second mesa separation ranges between about 1 microns to about 10 microns, with example separation values of 1, 2, 4, 7 and 10 microns, as well as within any of the ranges between any two of these values.

The mesas 560a-n are not drawn to scale, and are illustrated as rectangles having an equal mesa width 538 and mesa length 539 for simplicity. In some embodiments, however, each of the mesas 560a-n are rectangles having a mesa width 538 and a mesa length 539 that are not equal. In some embodiments, for example, each of the mesas 560a-n has a 2D line, or rectangular, geometry. In some embodiments, as described above, the mesa width, or the mesa width and length, is approximately equal to the target wavelength of light emitted from the intrinsic region, or are approximately equal to a multiple of 1 to 10 times the target wavelength. Values for the mesa width 538, for example, may be equal to a multiple of 1 to 10 times the target wavelength, as well as within any of the ranges between any two of these values. Values for the mesa length 539, for example, may be 0.25, 0.3, 0.5, 0.75, 1.0, 2.5, 3.0, 5.0, 7.5, 10, 50 and 100 microns, as well as within any of the ranges between any two of these values. Ratios for the mesa length to the mesa width, for example, may be 1-to-1, 10-to-1, 50-to-1 and 100-to-1, as well as within any of the ranges between any two of these ratios. In some embodiments, each of the mesas 560a-n has a mesa width 538 of about 250 nm to about 1 micron, and a mesa length 539 of about 250 nm to about 100 microns. In some embodiments, each of the mesas 560a-n has a mesa width 538 of about 250 nm, and a mesa length 539 that ranges from about 250 nm to about 100 microns. In some embodiments, each of the mesas 560a-n has a mesa width 538 of about 300 nm, and a mesa length 539 that ranges from about 300 nm to about 100 microns. In some embodiments, each of the mesas 560a-n has a mesa width 538 of about 500 nm, and a mesa length 539 that ranges from about 500 nm to about 100 microns. In some embodiments, each of the mesas 560a-n has a mesa width 538 of about 750 nm, and a mesa length 539 that ranges from about 750 nm to about 100 microns. In some embodiments, each of the mesas 560a-n has a mesa width 538 of about 1 micron, and a mesa length 539 that ranges from about 1 micron to about 100 microns. In some embodiments, each of the mesas 560a-n has a mesa width 538 of about 250 nm and a mesa length 539 of about 2.5 microns.

In other embodiments, each of the mesas 560a-n has a circular geometry (having a diameter equal to the mesa width 538, forming a cylinder mesa) or an oval geometry (having a minor axis equal to the mesa width 538 and a major axis equal to the mesa length 539, forming an elliptic cylinder mesa). In still other embodiments, each of the mesas 560a-n has a hexagonal geometry, forming a hexagonal prism mesa. Regardless of the geometrical shape, in some embodiments, one or more lateral dimensions (e.g., dimensions parallel to the plane defined by the substrate surface, or perpendicular to the emitted light direction) of the mesas are approximately equal to the target wavelength of light emitted from the intrinsic region, or are approximately equal to a multiple of 1 to 10 times the target wavelength.

FIG. 6A through FIG. 6G are cross-section schematic views of a simplified example semiconductor structure 600 (e.g., a portion of a die) at various stages of an example process (i.e., "the example process") for forming a deep-UV LED with small dimensions compared to conventional devices (e.g., 200 nm to 3000 nm, or from 750 nm to 3000 nm). Details of FIGS. 6A-G are briefly introduced below and discussed in detail with reference to FIGS. 8A-C.

Figure 6B:
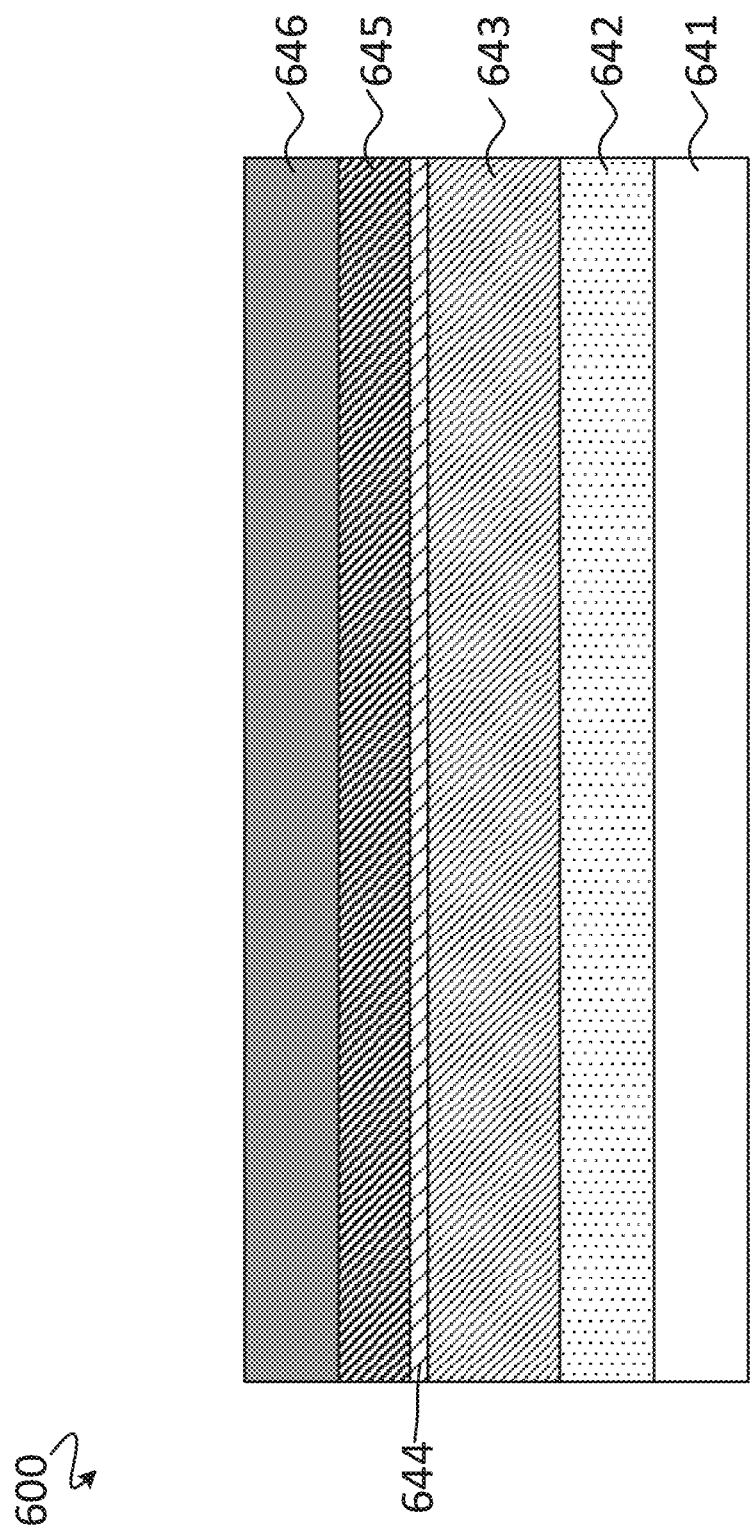

FIG. 6A shows the simplified semiconductor structure 600 formed during part of the example process. The semiconductor structure 600 includes a substrate 641, a buffer layer 642, a first active layer 643, a light emitting region (e.g., an intrinsic region) 644, and a second active layer 645. FIG. 6B shows the semiconductor structure 600 after a first electrical contact layer 646 is formed on the second active layer 645 as part of the example process. In some embodiments, the buffer layer 642 is an AlN buffer having a thickness of 400 nm. In some embodiments, the first electrical contact layer 646 is a p-metal contact layer that includes 2 nm of Ti and from 20 nm to 400 nm of Al, and the total thickness of the first electrical contact layer 646 is from about 20 nm to about 400 nm. In other embodiments, the Ti layer in the first electrical contact layer 646 can be from 1 nm to 10 nm. In some embodiments, the first electrical contact layer 646 is a p-metal contact layer that includes up to 50 nm of Os or Ni. In some embodiments, the substrate is a single crystal substrate, or is a substrate with a crystalline seed layer on the upper surface upon which layers 642 to 645 are grown. In some embodiments, the substrate can be sapphire, SiC, AlN, GaN, silicon, or diamond. In some embodiments, layers 642 to 645 are semiconductors deposited using an epitaxial film growth process, such as molecular beam epitaxy (MBE), or metal organic chemical vapor deposition (MOCVD). In some embodiments, a surface treatment, such as a chemical buffered oxide etch (BOE) surface treatment of the second active layer 645 is performed before the first electrical contact layer 646 is deposited. In some embodiments, the first electrical contact layer 646 is deposited in-situ directly after formation of the active layer 645 using an epitaxial film growth process.

Figure 6C:
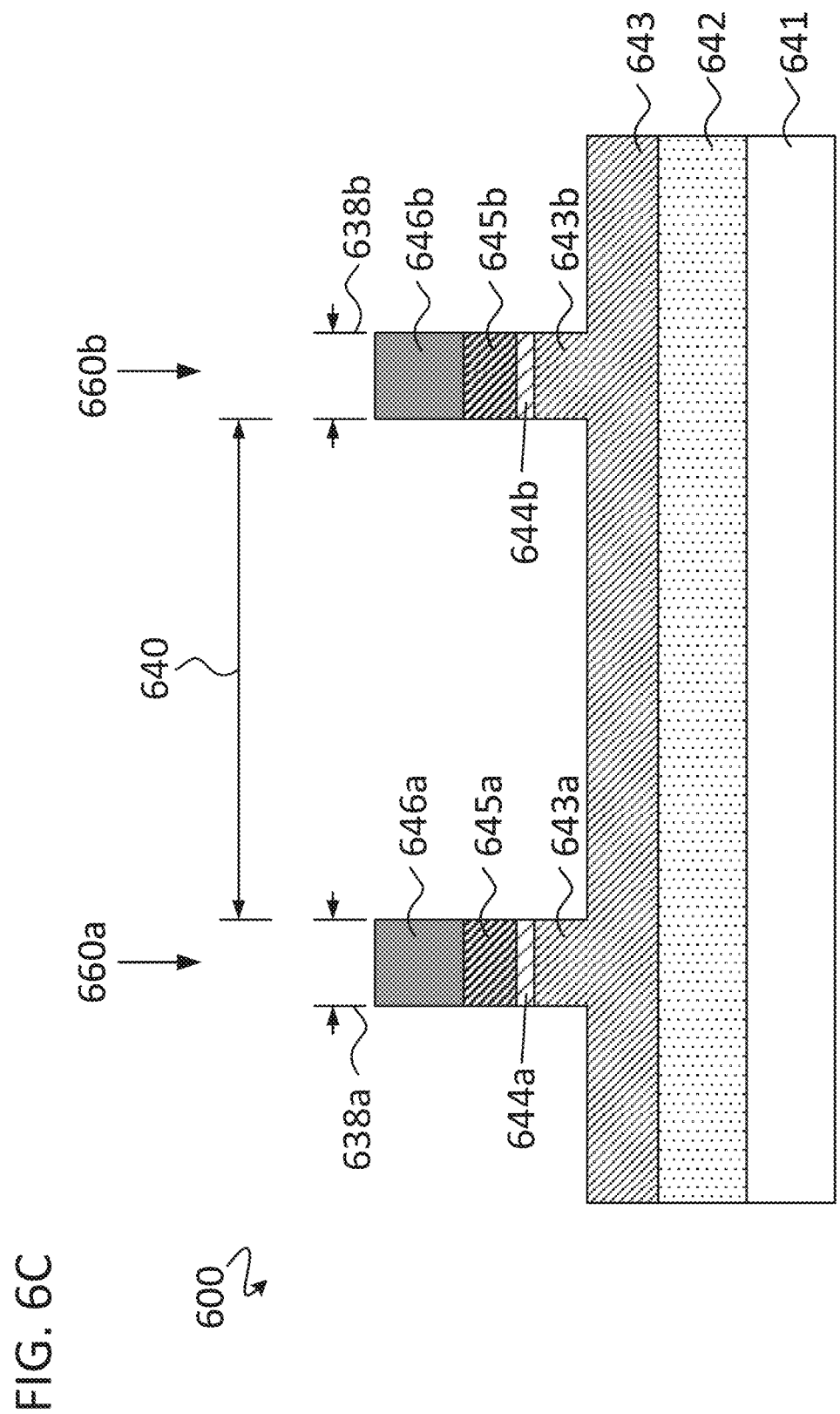

FIG. 6C shows the semiconductor structure 600 after a first mesa region 660a and a second mesa region 660b have been formed as part of the example process. The first mesa region 660a includes a portion 643a of the first active layer 643, a portion 644a of the light emitting region 644, a portion 645a of the second active layer 645, and a portion 646a of the first electrical contact layer 646. The second mesa region 660b includes a portion 643b of the first active layer 643, a portion 644b of the light emitting region 644, a portion 645b of the second active layer 645, and a portion 646b of the first electrical contact layer 646. The first mesa region 660a has a mesa width (or diameter in the case of a cylindrical mesa) ($W_x$) 638a and the second mesa region 660b has a mesa width (or diameter) ($W_x$) 638b. Also shown is a mesa separation width 640 (e.g., similar to the first and/or second mesa separations 540a and 540b) between the first mesa region 660a and the second mesa region 660b. In some embodiments, the mesa regions 660a-b are formed using a deep-UV track and a scanner exposure photolithography system. In some embodiments, the mesa regions 660a-b and the first electrical contacts 646a-b are exposed and etched at the same time. In some embodiments, the first electrical contact layer 646 of the semiconductor structure 600 has a thickness of about 200 nm, and the mesa regions 660a-b of the semiconductor structure have a mesa thickness of about 380 nm. In such an embodiment, the total etch depth is about 590 nm. In other embodiments, the combined thickness of the layers comprising the mesa is greater than, or less than 590 nm, or from about 200 nm to about 1000 nm, or from about 200 nm to about 3500 nm.

Referring back to FIG. 6B, the first electrical contact layer 646 is advantageously formed across the lateral extent of the second active layer 645 before mesa formation is performed. By forming the first electrical contact layer 646 before mesa formation (e.g., etching), rather than later depositing the first electrical contact layer 646 on top of mesas, smaller mesa sizes are achieved. This is because standard conventional metal lift-off processes may not have the required resolution (e.g., from about 210 nm to about 300 nm, or from about 200 nm to about 3000 nm, or from about 750 nm to about 3000 nm). Additionally, the first electrical contact layer 646 advantageously protects the second active layer 645 from possible etch or post-etch damage. Particularly, p-type GaN is sensitive to etch damage, and capping the top p-type GaN layer of the semiconductor structure with metal prior to etch protects the p-type GaN. Forming mesas with lateral dimensions below about 1 micron is challenging and requires advanced semiconductor processing. Forming mesas with lateral dimensions below about 400 nm is even more challenging and requires semiconductor processing with exceptional resolution. In some embodiments, metal lift-off processes or processes where the first electrical contact layer 646 is formed before the mesa is etched can both be used. In either case, achieving lateral mesa dimensions less than 1 micron or less than 400 nm may require advanced semiconductor processing methods and equipment.

Figure 6D:
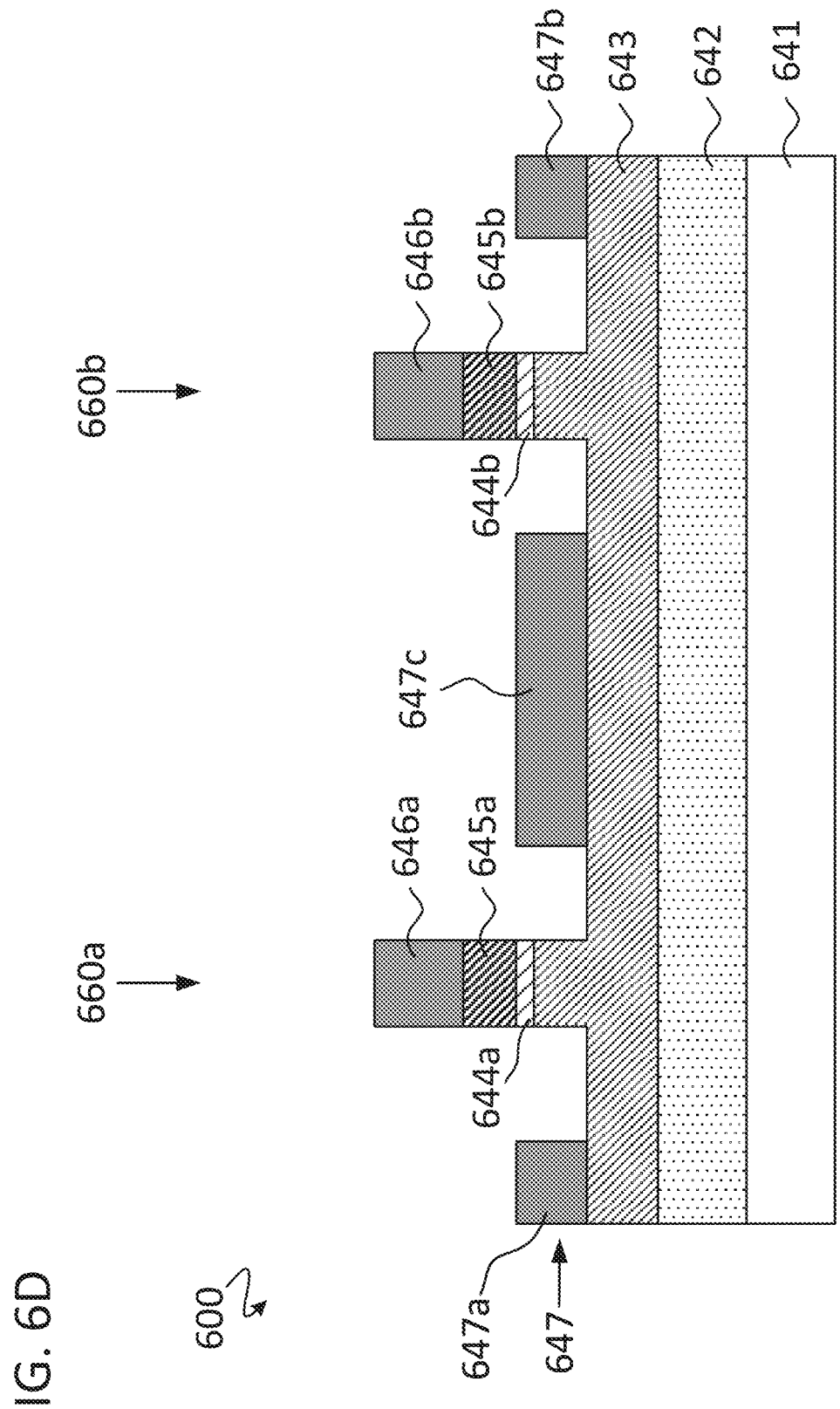

FIG. 6D shows the semiconductor structure 600 after the addition of second electrical contact layer portions 647a-c of a second electrical contact layer 647 are formed on the first active layer 643 as part of the example process. In some embodiments, the second electrical contact layer portions 647a-c are in electrical contact with each other. In some embodiments, the second electrical contact layer 647 includes Ti and/or Al. In some embodiments, the second electrical contact layer portions 647a-c contain a Ti layer with a thickness of about 2 nm and an Al layer with a thickness of about 400 nm. In some embodiments, the second electrical contact layer 647 is formed by lift-off metallization process. In some embodiments, the second electrical contact layer 647 is formed by an etch process, whereby metal for the electrical contact layer 647 is deposited, and then a patterned metal layer etch process is performed to create the electric contact layer 647.

FIG. 6E shows the semiconductor structure 600 after the addition of a passivation layer 648 as part of the example process. In some embodiments, the passivation layer 648 is $SiO_2$, $Si_3N_4$, $Al_2O_3$ (or any other suitable dielectric material) and has a thickness of about 200 nm, or from 10 nm to 1000 nm.

FIG. 6F shows the semiconductor structure 600 after portions of the passivation layer 648 are removed to expose the first electrical contacts 646a-b and to expose the electrical contact layer portion 647c as part of the example process. In some embodiments, the portions of the passivation layer 648 are removed using a lithographic process (e.g., a process using a scanner with deep-UV illumination).

In some embodiments, a plasma etching system is used to etch the openings and a post etch clean process is also performed.

Figure 6G:
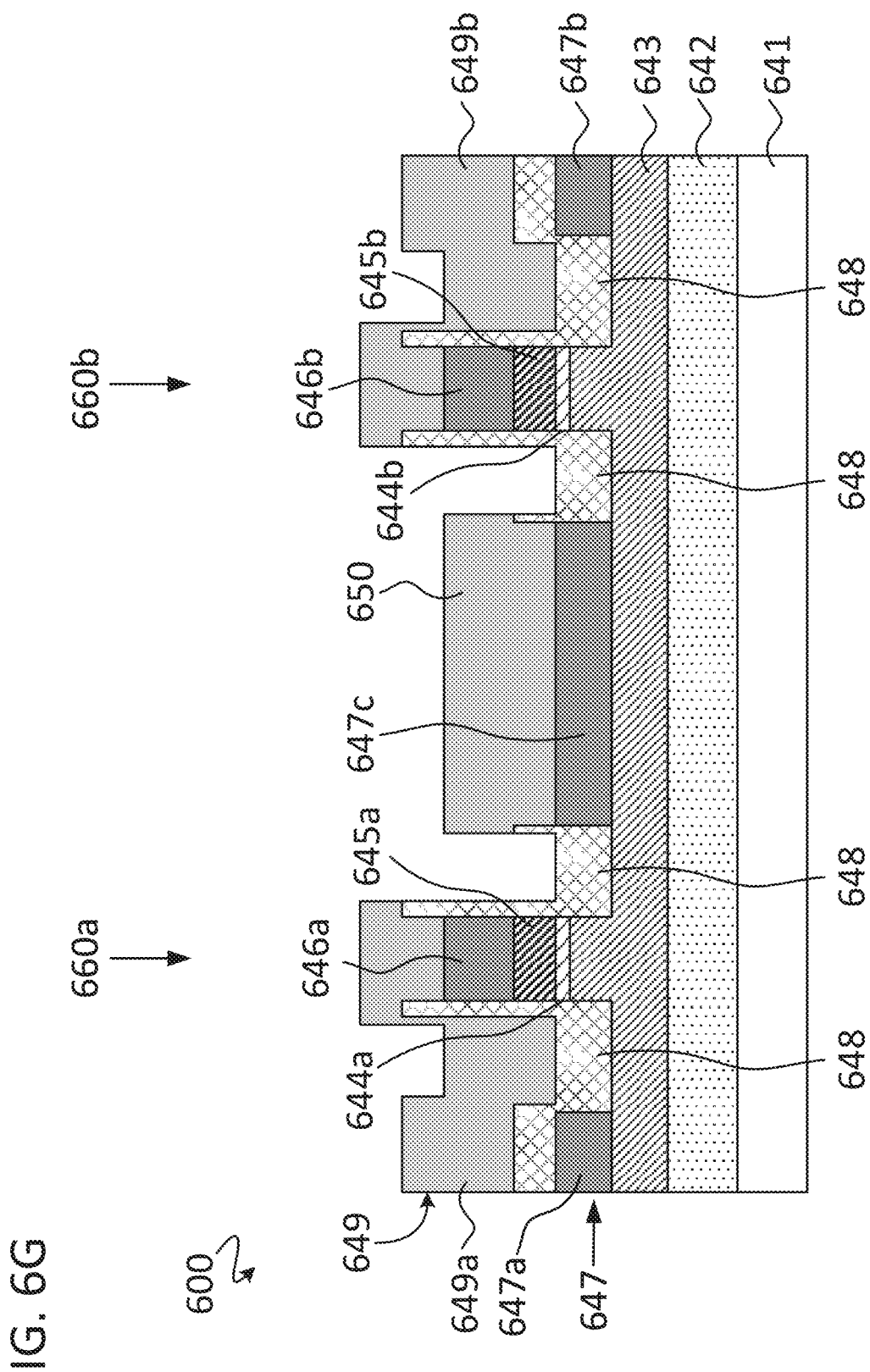

FIG. 6G shows the semiconductor structure 600 after portions 649a-b of a first terminal contact layer 649 are formed on the first electrical contacts 646a-b (and adjoining portions of the passivation layer 648), and a second terminal contact layer 650 is formed on the portion 647c of the second electrical contact layer 647 as part of the example process. In some embodiments, the first terminal contact layer 649 and/or the second terminal contact layer 650 includes about 300 nm of Al (or AlCuSi) formed using a metal deposition process. In some embodiments, the first terminal contact layer 649 and/or the second terminal contact layer 650 include up to 1 micron of Al or AlCuSi and are formed using a metal deposition process.

FIG. 7A through FIG. 7H show plan views of a semiconductor structure 700 formed during the example process. Details of FIGS. 7A-H are briefly introduced below and discussed in detail with reference to FIGS. 8A-C. FIGS. 7A-7H are not drawn to scale, and features in FIGS. 7A-7H may be different sizes from one another, even if they appear not to be.

Figure 7A:
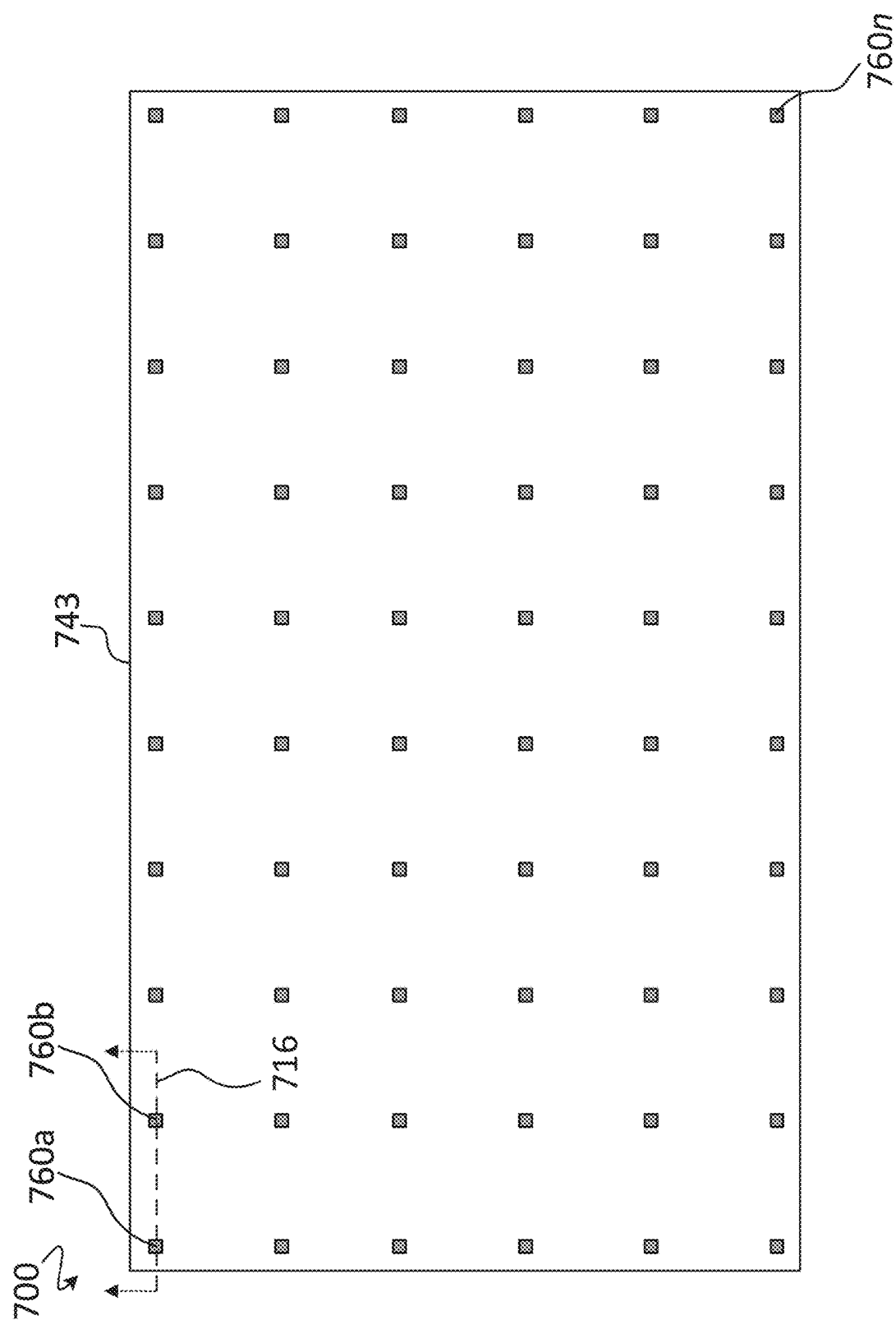

The semiconductor structure 700 of FIG. 7A includes a first active layer 743 (similar to the first active layer 643), and mesa regions 760a-n which are similar to the mesa regions 660a-b. The semiconductor structures 600, which were shown in FIG. 6D, are similar to a portion of the semiconductor structure 700. This is illustrated by a cross-section line 716 that corresponds to the cross-section views shown in FIGS. 6A-6G. However, like numbered figures related to the semiconductor structure 600 and the semiconductor structure 700 do not necessarily correspond to the same stage of the example process. For example, the semiconductor structure 600 shown in FIG. 6A and the semiconductor structure 700 shown in FIG. 7A are not necessarily at the same stage of the example process disclosed herein.

Figure 7B:
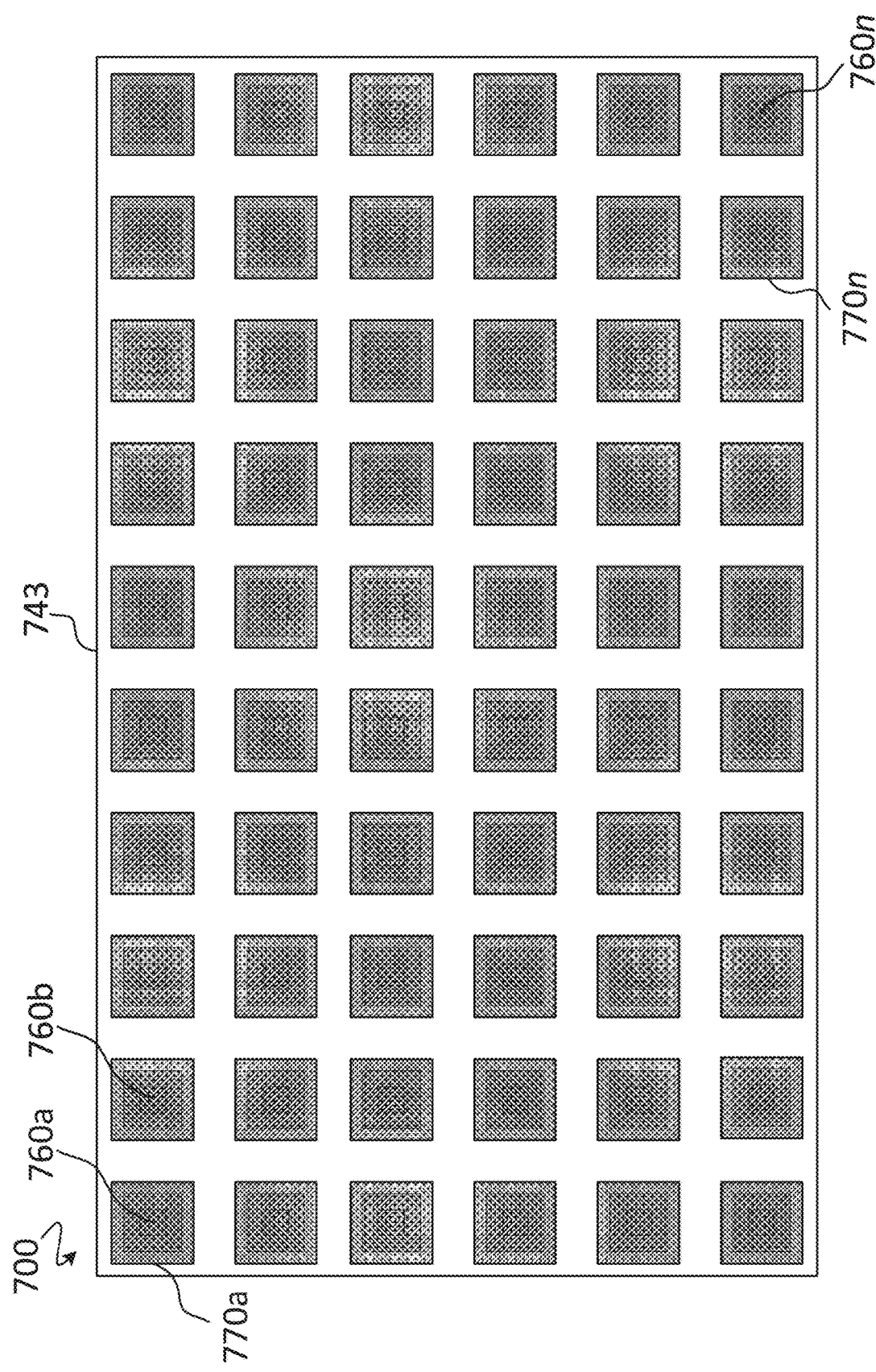
Figure 7C:
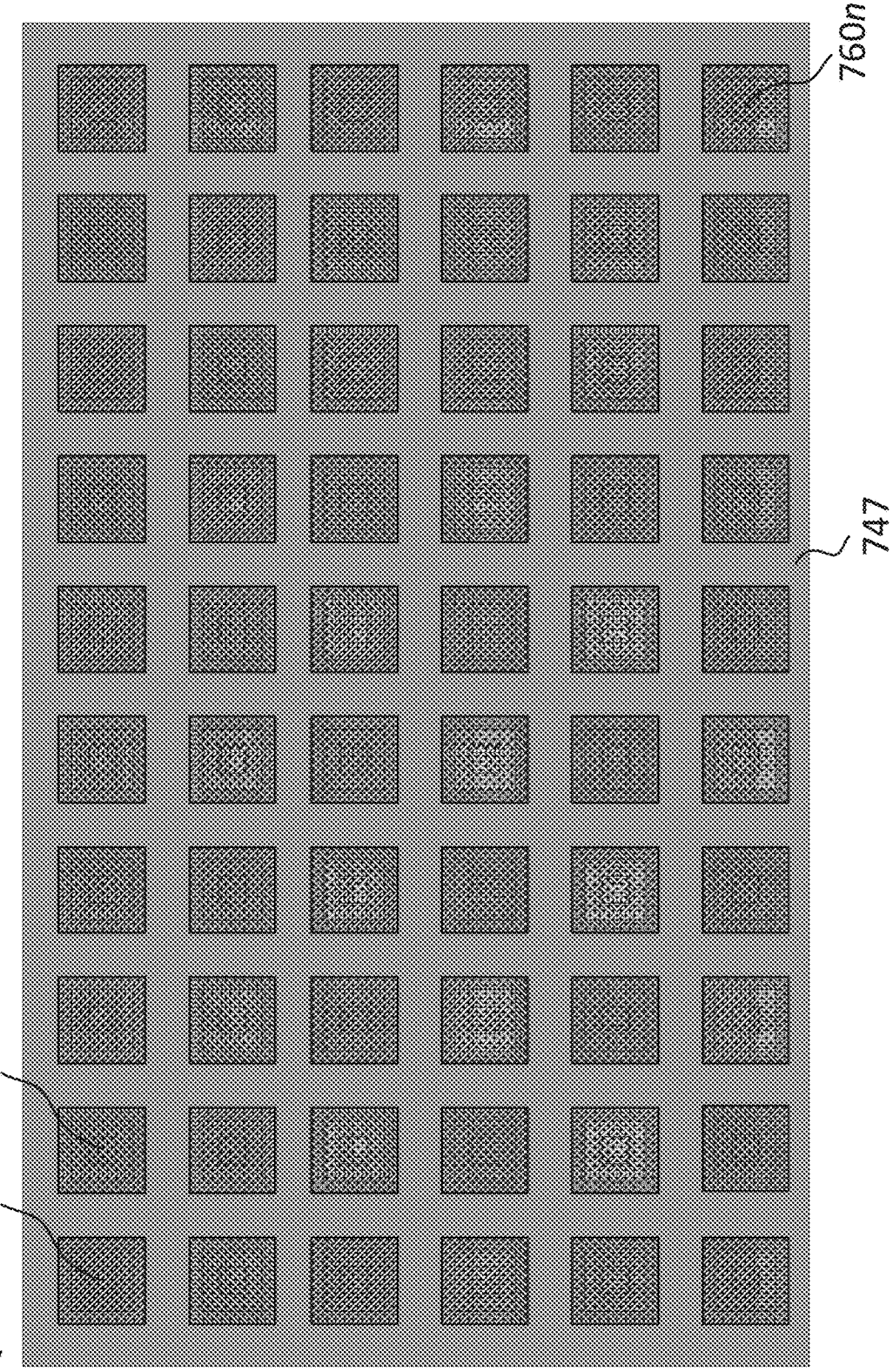
Figure 7D:
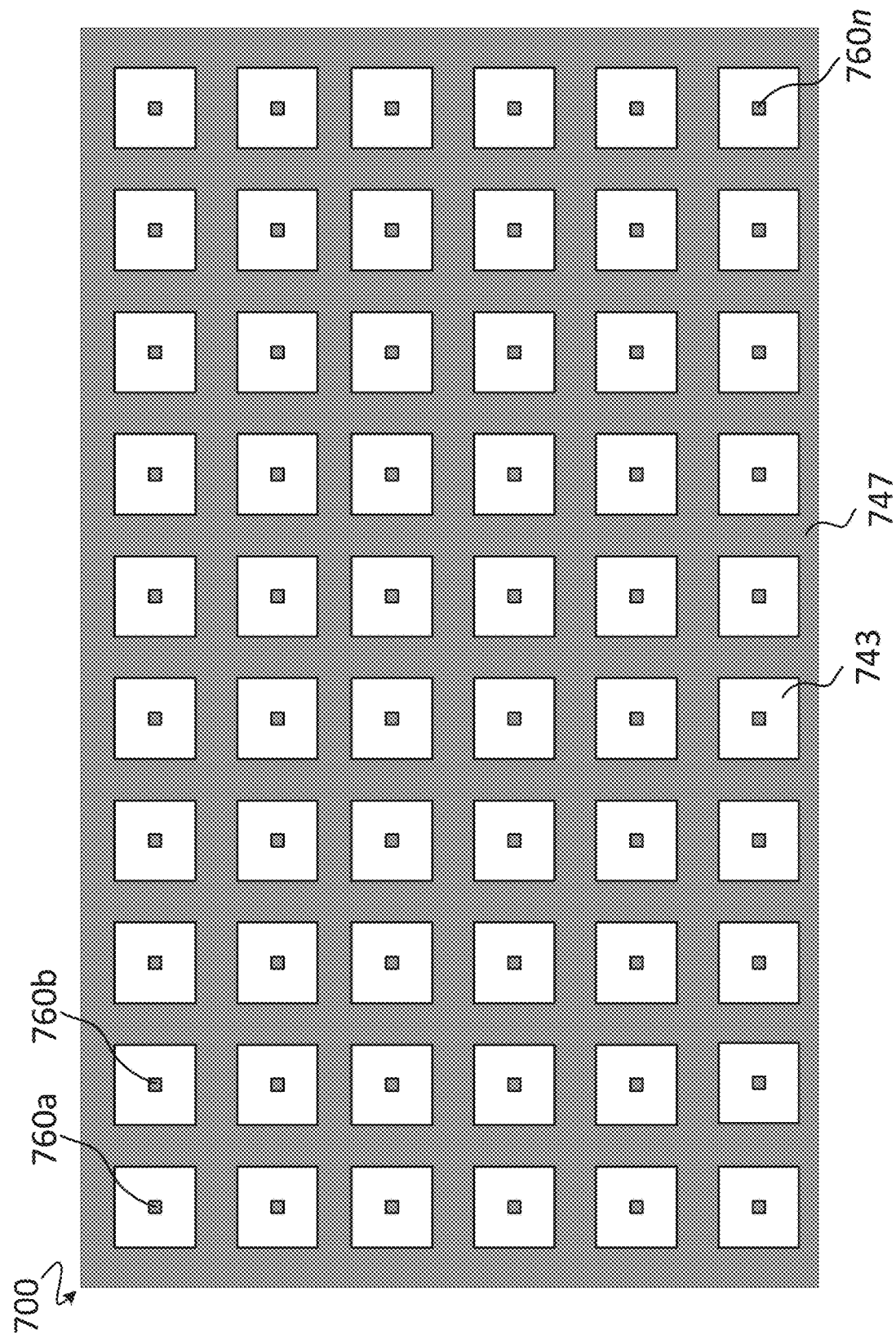
Figure 7E:
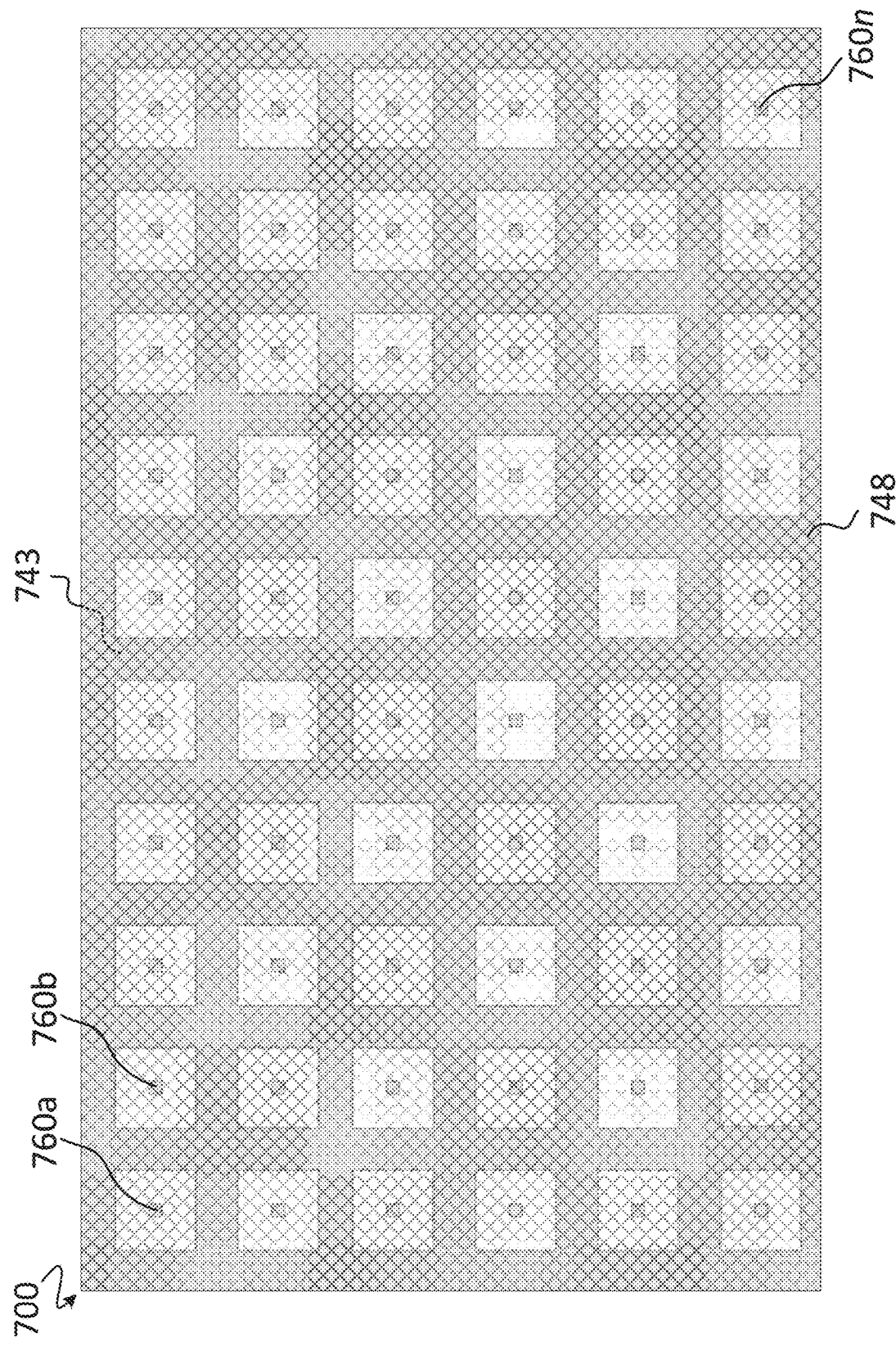
Figure 7G:
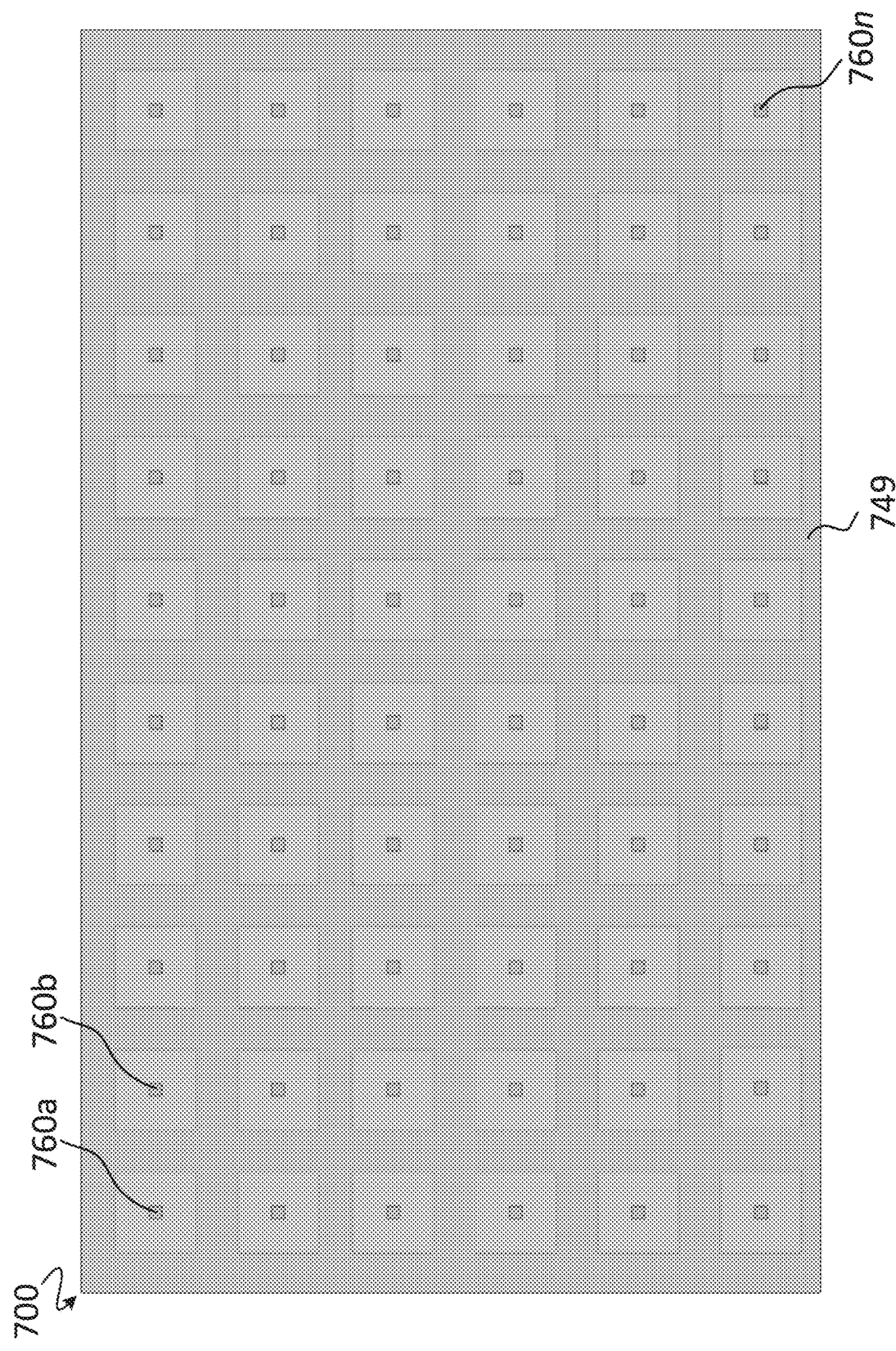
Figure 7H:
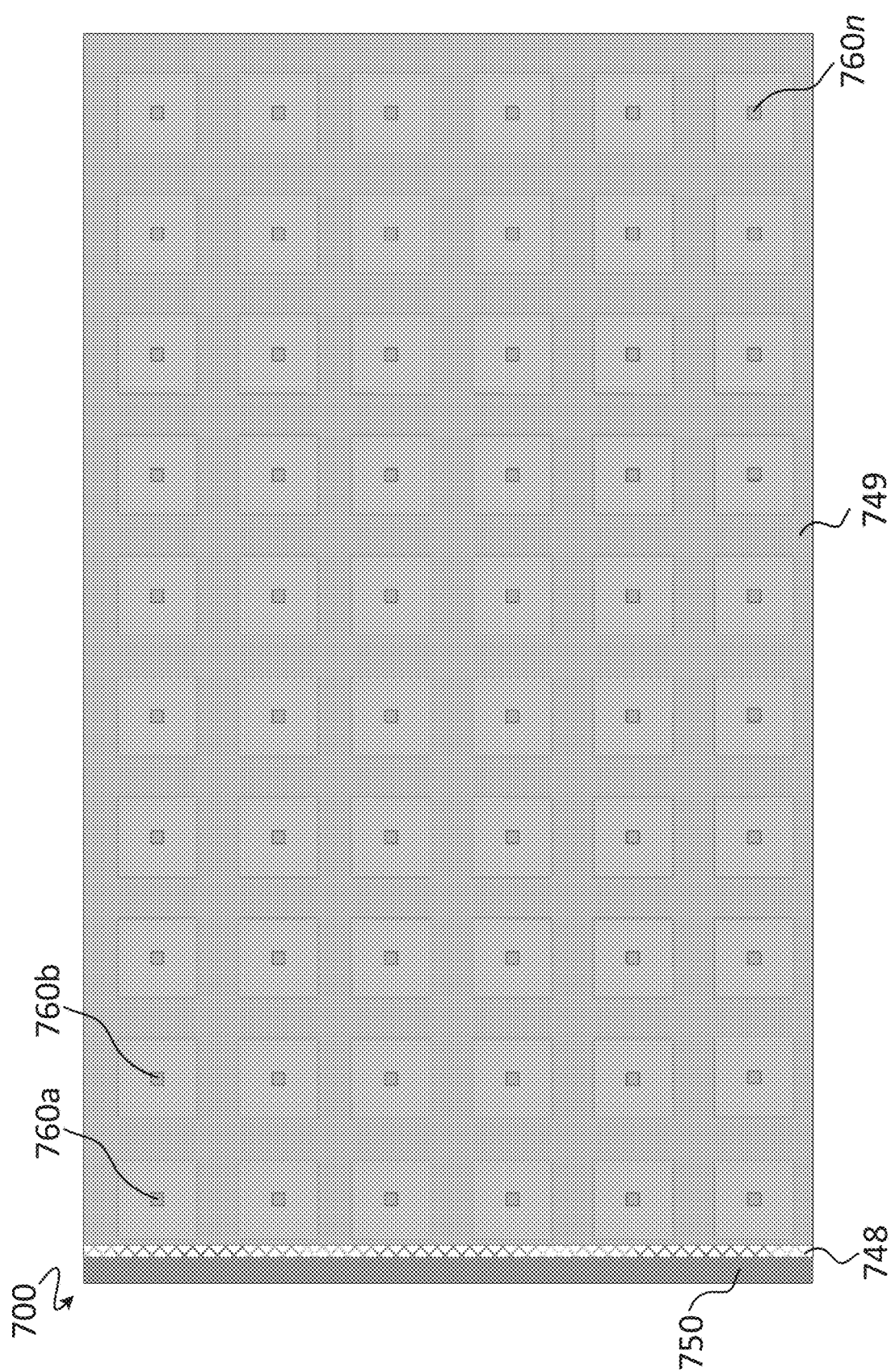

FIG. 7B shows the semiconductor structure 700 after photoresist coated and exposed regions 770a-n have been deposited on the mesa regions 760a-n and portions of the first active layer 743, as part of the example process. FIG. 7C shows the semiconductor structure 700 after a second electrical contact layer 747 has been deposited on portions of the first active layer 743 and the photoresist regions 770a-n, as part of the example process. FIG. 7D shows the semiconductor structure 700 after portions of the second electrical contact layer 747 and the photoresist regions 770, shown in the previous figures, have been removed as part of the example process. FIG. 7E shows the semiconductor structure 700 after a passivation layer 748 has been deposited onto portions of the first active layer 743, onto the second electrical contact layer 747 (not shown in FIG. 7E), and onto the mesa regions 760a-n as part of the example process. FIG. 7F shows the semiconductor structure 700 after portions of the passivation layer 748 have been removed to expose first electrical contacts of the mesa regions 760a-n (similar to the first electrical contacts 646a-b of FIG. 6F) as part of the example process. FIG. 7G shows the semiconductor structure 700 after a first terminal contact layer 749 is deposited onto the insulating layer 748 (not shown in FIG. 7G) and onto the respective exposed first electrical contacts of the mesa regions 760a-n. FIG. 7H shows the semiconductor structure 700 after a portion of the first terminal contact layer 749 has been removed and a second terminal contact layer 750 has been deposited onto a portion of the second electrical contact layer 747 (not shown in FIG. 7H).

In some embodiments, advanced device fabrication processes are used to form the deep-UV LED devices with small dimensions compared to conventional devices (e.g., 200 nm to 3000 nm, or from 750 nm to 3000 nm). In some embodiments, the device epitaxial structures include an AlN buffer. In some embodiments, NIP (i.e., n-type, intrinsic, and p-type) SLS layers are grown on sapphire substrates using plasma assisted molecular beam epitaxy (PAMBE). In some embodiments, p-type ohmic metal layers (with optional optically reflective metal) such as Ti/Al are deposited onto the epitaxial structure. In some embodiments, a scanner lithographic process is used to create mesa structures with small dimensions compared to conventional devices (e.g., 200 nm to 3000 nm, or from 750 nm to 3000 nm). Then, in some embodiments, a plasma etch process is used to etch off the metal and nitride layers to the n-type SLS layer, which is used for an n-type contact. A lift-off process can follow, which includes patterning and n-metal deposition (Ti/Al) to create n-type metals to surround the formed mesas (active region). In order to interconnect the separated mesas, an oxide layer can be used to passivate the mesas and metals, and then a scanner process can be used to create via holes which enable second metals to interconnect the first p-metal layers on those mesas by either a lift process or etch method. In some embodiments, standard passivation and pad opening processes can then be used.

Figure 8B:
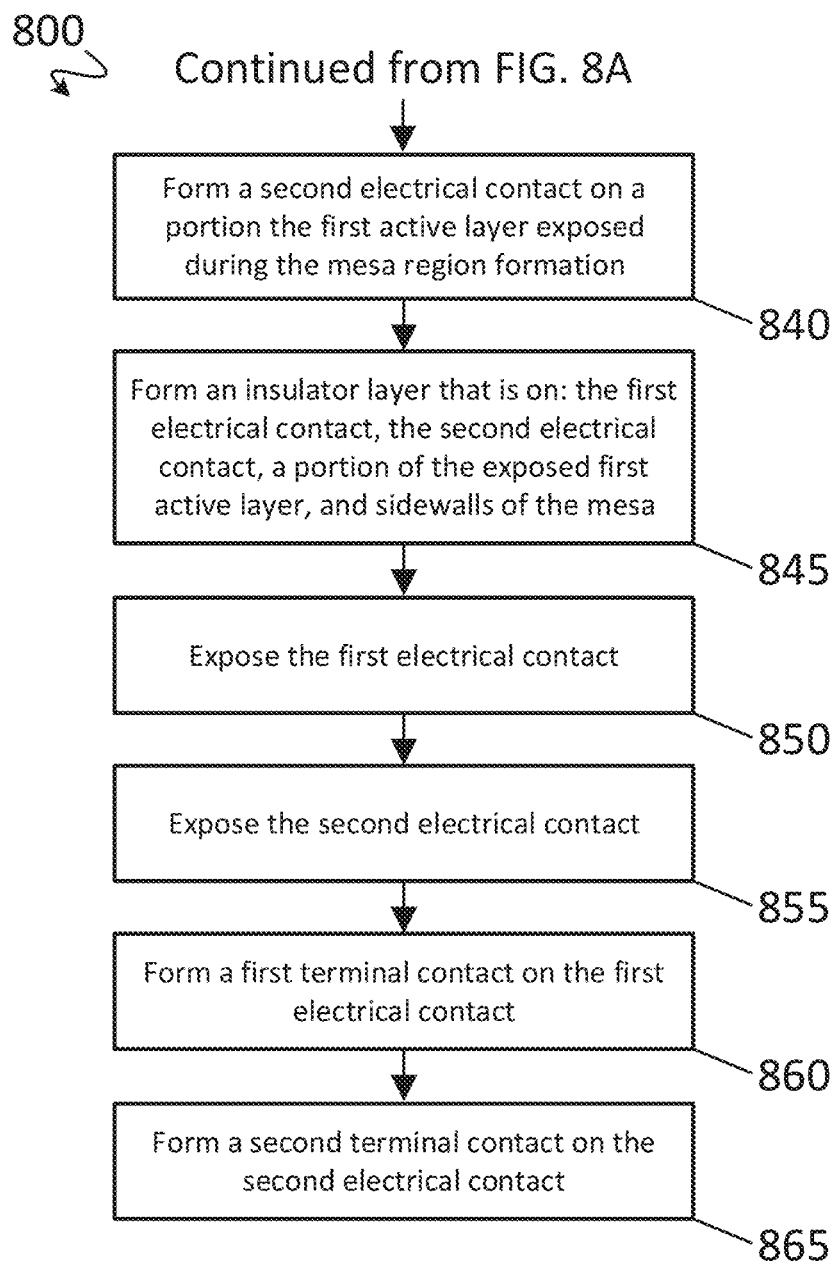

Details of an example process 800 for forming a deep-UV LED are provided in FIG. 8A through FIG. 8B with reference to FIGS. 6A-G and FIGS. 7A-H.

At step 805 of FIG. 8A, with reference to FIG. 6A, a substrate (641) is provided. At step 810, a buffer layer (642) is formed on the substrate (641). At step 815, a first active layer (643) is formed on the buffer layer (642). At step 820, a light emitting region (644) is formed on the first active layer (643). The light emitting region is configured to emit light having a target wavelength (e.g., 265 nm, or 210 nm to 300 nm). At step 825, a second active layer (645) is formed on the light emitting region (644). Optionally, an electron blocking layer can be formed before the second active layer, forming a structure with the electron blocking layer between the light emitting region and the second active layer.

At step 830, with reference to FIG. 6B, a first electrical contact layer (646) is formed on the second active layer (645). At step 835, with reference to FIG. 6C and FIG. 7A, a mesa (660a-b/760a-n) is formed. In some embodiments, multiple mesas are formed and the mesa formed at step 835 is among the multiple mesas formed. As was discussed earlier, each mesa has a mesa area defined by mesa dimensions (e.g., a mesa width and a mesa length, or a mesa diameter, or an axis of an oval, in a horizontal plane that is parallel to the substrate (641)). In some embodiments, the mesa dimension (e.g., length and/or width, or diameter) is equal to, or is a multiple of, the target wavelength of light. In some embodiments, the multiple is 1. In other embodiments, the multiple is between 1 and 10, inclusive. Additionally, the mesas are separated by a first mesa separation and by a second mesa separation, which can be the same or different. The mesa separations are chosen, in some embodiments, to allow sufficient space for an electrical contact layer (647/747 of FIG. 6D/7D) to be formed on the first active layer (643/743) between the mesas (660a-b/760a-n). In some embodiments, one or both of the mesa separations is about 2 microns to about 10 microns and the width of the electrical contact layer (647/747) between the mesas (660a-b/760a-n) is about 1 micron to about 5 microns.

The simplified example process for forming a deep-UV LED is continued in FIG. 8B. At step 840, with reference to FIG. 6D and FIGS. 7B-D, a second electrical contact layer (647/747) is formed on a portion of the first active layer (643/743) that was exposed during mesa formation of step 835. In some embodiments, step 840 includes a metal lift-off process.

At step 845, with reference to FIG. 6E and FIG. 7E, an insulator layer (i.e., a passivation layer (648/748)) is formed on the first electrical contact layer (646), the second electrical contact layer (647/747), portions of the exposed first active layer (643/743) and the sidewalls of the mesas (660a-b/760a-n). At step 850, with reference to FIG. 6F and FIG. 7F, the first electrical contact layer (646) is exposed.

Two example embodiments for forming a first electrical contact layer and a second electrical contact layer will be discussed. In a first embodiment, at step 855, with reference to FIG. 6F, the second electrical contact layer (647) is exposed. At step 860, with reference to FIG. 6G, a first terminal contact layer (649) is formed on the first electrical contact layer (646). Then, at step 865, with reference to FIG. 6G, a second terminal contact layer (650) is formed on the second electrical contact layer (647).

In a second embodiment, with reference to FIG. 7G, the first terminal contact layer (749) is deposited on the passivation layer (748, of FIG. 7F) and the exposed second electrical contacts of the mesas (760a-n) before the second electrical contact layer (747, of FIG. 7D) is exposed. Then, with reference to FIG. 7H, a portion of the first terminal contact layer (749) and a portion of the passivation layer (748) is removed (e.g. using a metal lift-off process) to expose a portion of the second electrical contact layer (747, of FIG. 7D). Then, the second terminal contact layer (750) is deposited on the exposed portion of the second electrical contact layer (747, of FIG. 7D).

Figure 8C:
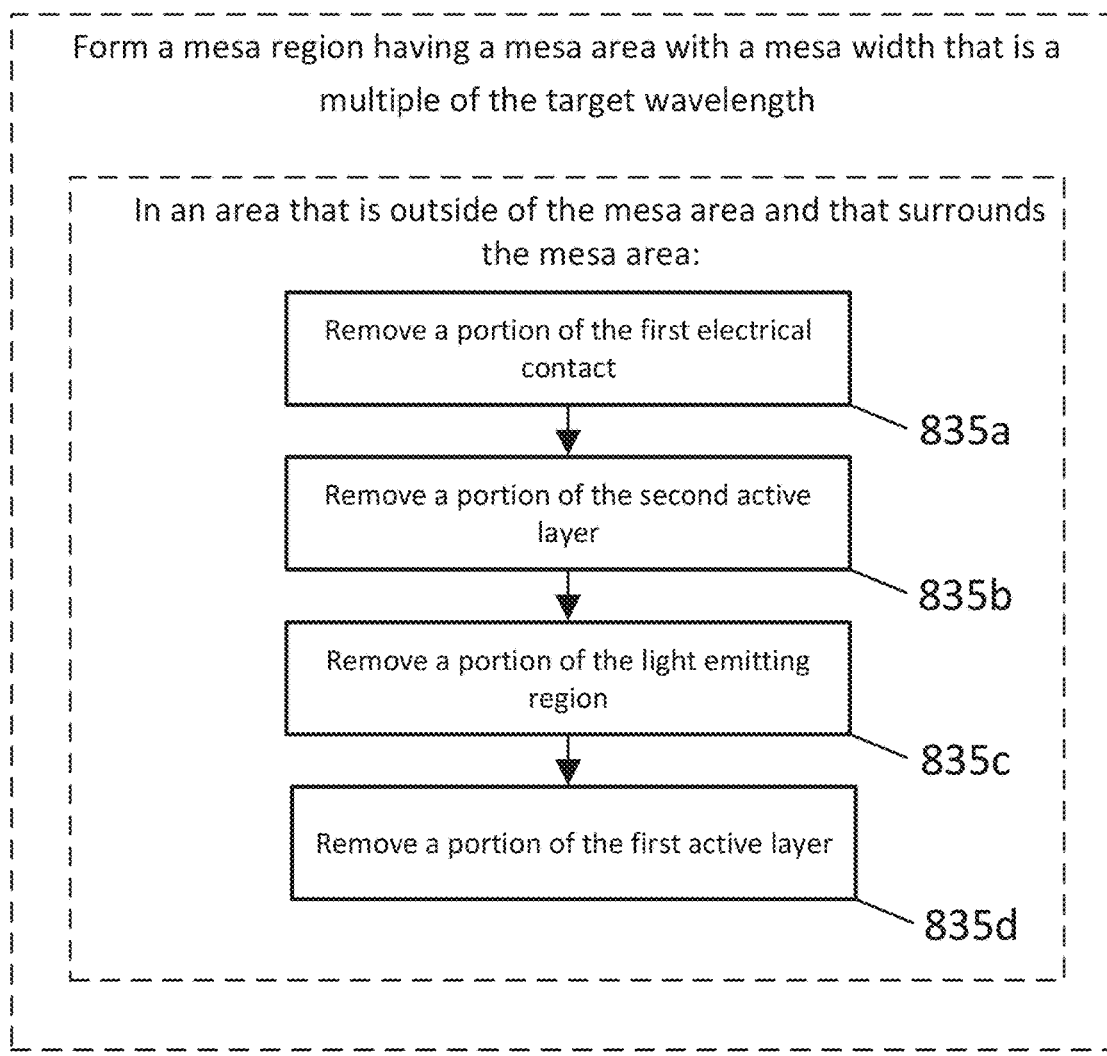

Details of an example process for mesa formation of step 835 are shown in FIG. 8C. At step 835a, with reference to FIG. 6C, a portion of the first electrical contact layer (646) is removed. At step 845b, a portion of the second active layer (645) is removed. At step 835c, a portion of the light emitting region (644) is removed. Then, at step 835d, a portion of the first active layer (643) is removed. As shown in FIG. 6C, by removing the aforementioned portions, the mesas 660a-b are formed. In some embodiments, the mesas 660a-b are formed using an etching process.

Figure 9A:
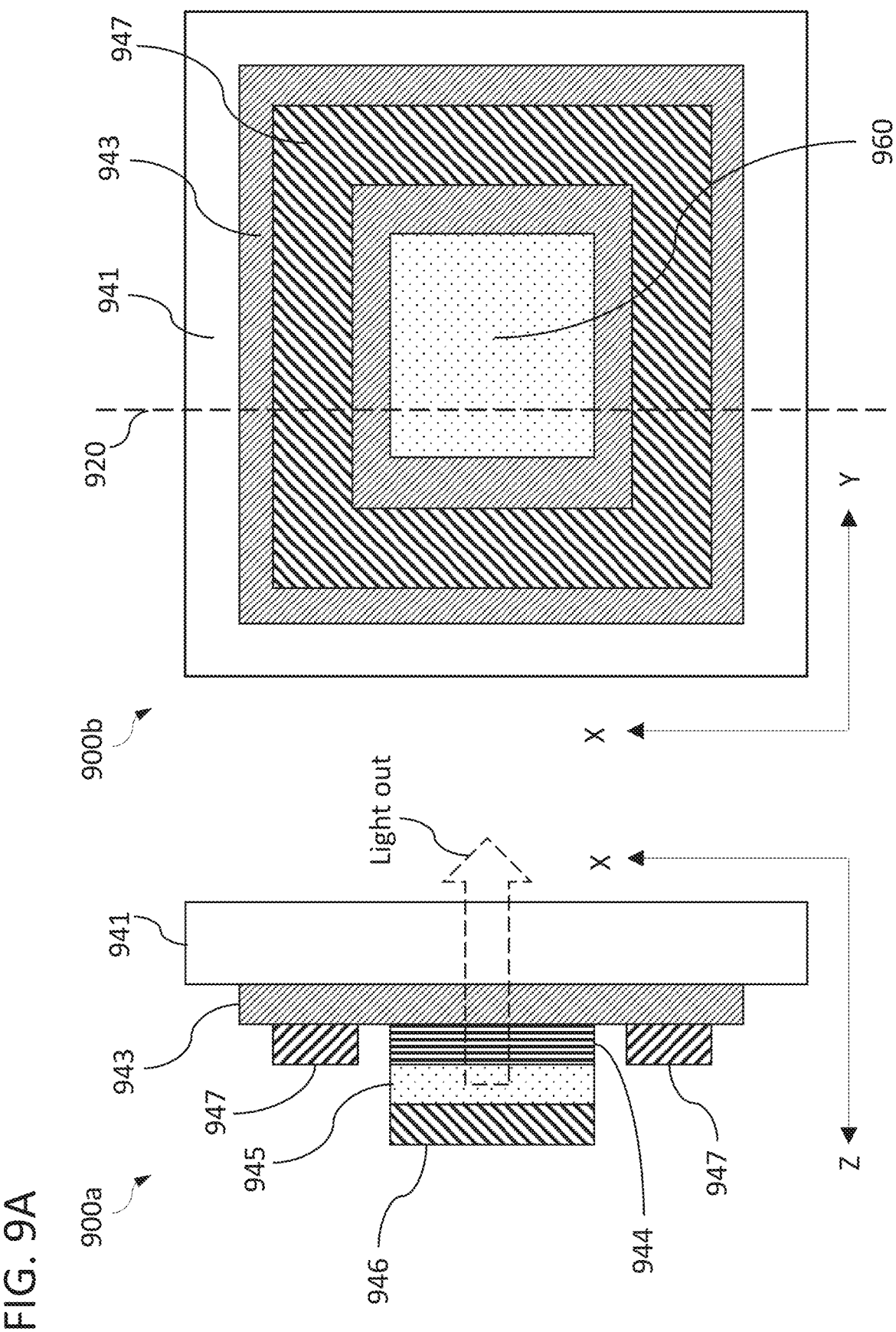
FIG. 9A shows a simplified cross-section and a simplified plan view schematic illustrating an example semiconductor structure, in accordance with some embodiments.

FIG. 9A illustrates a simplified schematic of an embodiment of a portion of a deep-UV LED semiconductor structure in cross-section 900a and in plan view 900b. A cross-section indicator 920 is taken through the plan view 900b for the top cross-section view 900a. The semiconductor structure shown in FIG. 9A includes a substrate 941, a first active layer 943, a light emitting region 944 (e.g., an intrinsic region), a second active layer 945, a first electrical contact 946, and a second electrical contact 947. The first electrical contact 946 is omitted in the plan view structure 900b so that the active region of the mesa 960 can be illustrated. In some embodiments, the first active layer 943 is an n-type region, the light emitting region 944 is an intrinsic region, the second active layer 945 is a p-type region, together forming a PIN device. In such embodiments, the first active layer 943 provides n-type conductivity, the second active layer 945 provides p-type conductivity, and electrons and holes recombine within the light emitting region 944 to emit light.

Figure 9B:
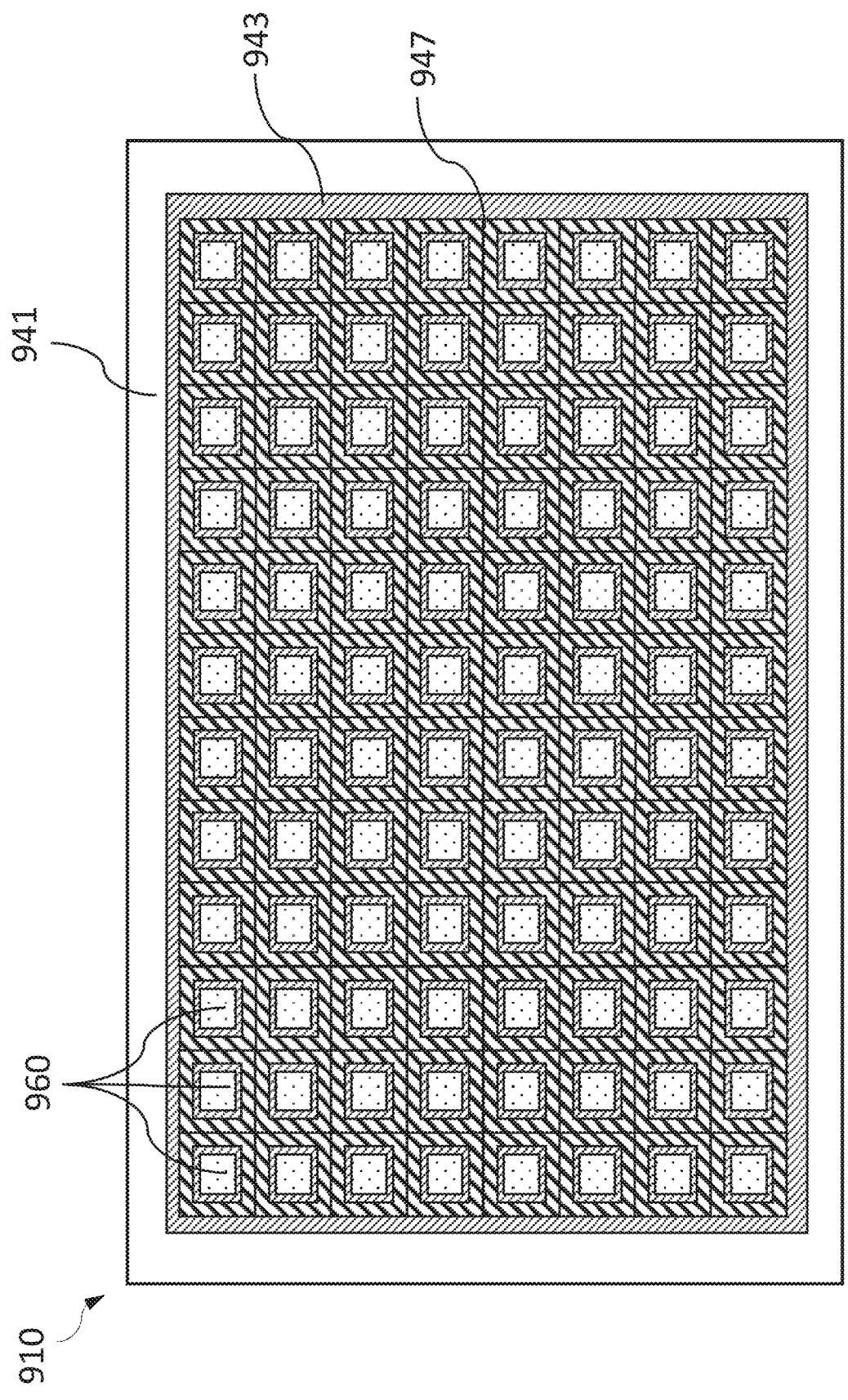
FIG. 9B shows a simplified plan view schematic illustrating an example of an array of the semiconductor structures in FIG. 9A, in accordance with some embodiments.

FIG. 9B illustrates a simplified schematic of an embodiment of an array of deep-UV LED semiconductor structures in plan view 910. In this example, the mesas 960 are separated by a small distance to accommodate the second electrical contacts 947, which are required to conduct current to each of the mesas 960. In this example, the first active layer 943 and the substrate 941 are also visible at the edges of the array. In some embodiments, an array of deep-UV LED semiconductor structures is arranged on a single substrate (or die) in a close-packed geometry to increase the light output per substrate (or die) area. In some embodiments, the optically active area (i.e., the area within the plurality of mesas where EHR occurs) is greater than 20%, or greater than 30%, or greater than 40%, or greater than 50%, or greater than 60%, or greater than 70%, or greater than 80% of the total substrate (or die) area.

Figure 10:
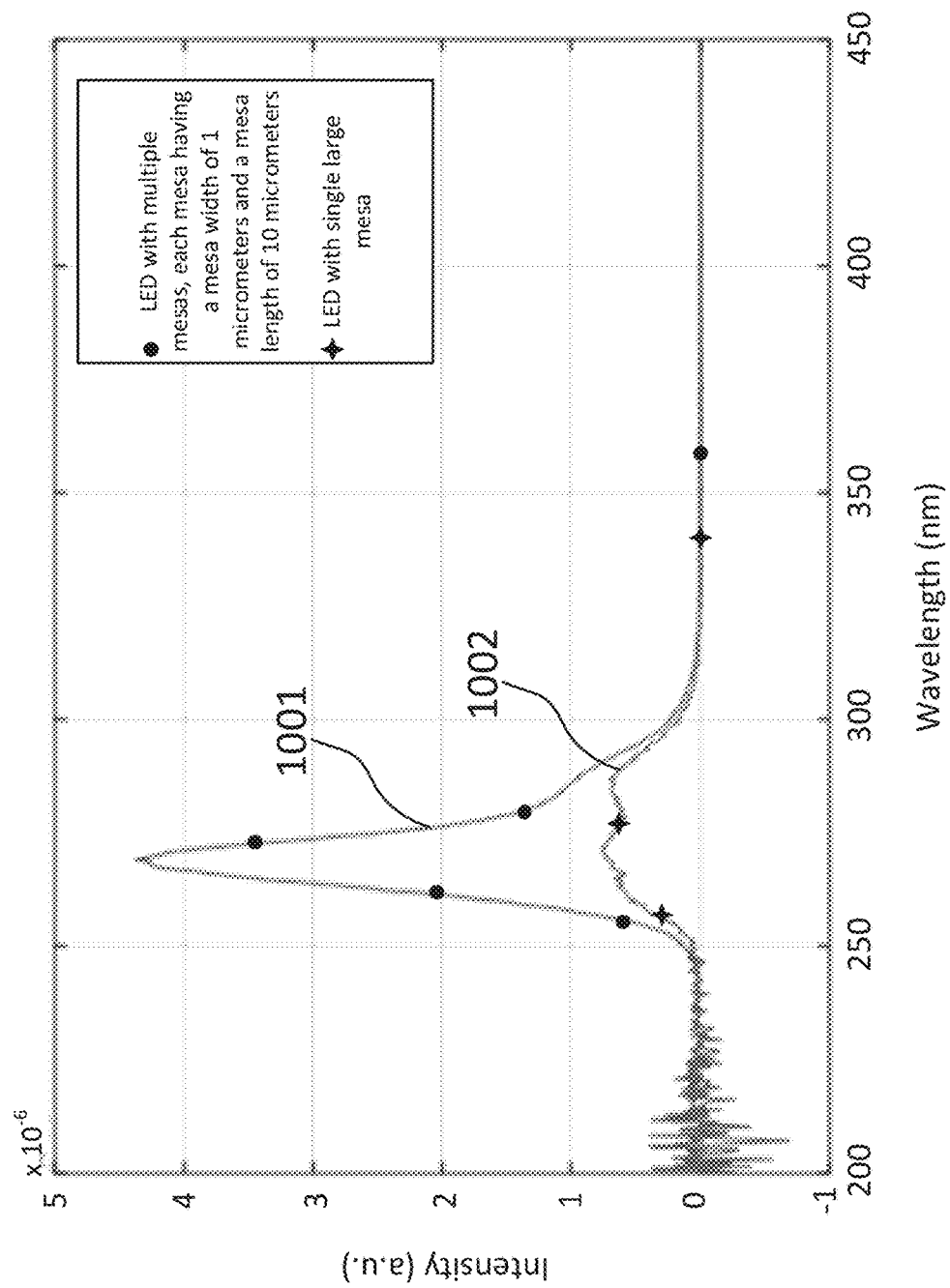
FIG. 10 is a graph showing plotted test results.

FIG. 10 is a graph 1000 showing plotted test results 1001 and 1002. The plot 1001 and the plot 1002 each correspond to measured light intensity as a function of emitted wavelength as measured from two respective deep-UV LEDs under the same driving conditions. The plot 1001 corresponds to a deep-UV LED having multiple mesas (similar to the semiconductor superstructure 301 of FIG. 3), each mesa having a mesa width of 1 micron and a mesa length of 10 microns, with a separation length of 3 microns between the mesas. Therefore, one dimension of the mesa is about 3.5 to 4 times the target output light wavelength. The plot 1002 corresponds to a deep-UV LED having a single large mesa (similar to the semiconductor superstructure 302 of FIG. 3). The light intensity was measured within 1 mm above the surface of the deep-UV LEDs. The deep-UV LEDs were driven using a 20 mA injection current. As shown, the deep-UV LED corresponding to the plot 1001 (having multiple mesas) exhibits an unexpectedly large increase in light emission, about 5-times higher peak power energy compared to the deep-UV LED corresponding to the plot 1002 (having a single, large, mesa). The increase in light emission for the device with multiple small mesas is due to both the improvement in EHR uniformity within each mesa and the improvement in transverse mode confinement provided by the small mesas. The plot 901 exhibits a main emission peak wavelength of 268 nm and a shoulder at 288 nm.

In some embodiments, the deep-UV LEDs described herein (e.g., with mesas similar to the mesa depicted in the semiconductor structure 460 in FIG. 4) emit non-coherent light, with wavelengths from 200 nm to 300 nm, and have efficiency from 10 to 100, or from 10 to 1000, or from 1 to 1000, or from 1 to 100 lumens per Watt. In some embodiments, the deep-UV LEDs described herein (e.g., with mesas similar to the mesa depicted in the semiconductor structure 460 in FIG. 4) emit coherent light, with wavelengths from 200 nm to 300 nm, and have total electrical-to-optical power efficiency (i.e., the ratio of optical output power to consumed electrical input power) from 0.1% to 90%. In some embodiments, the deep-UV LEDs described herein (e.g., with mesas similar to the mesa depicted in the semiconductor structure 460 in FIG. 4) emit non-coherent light, with wavelengths from 200 nm to 300 nm, and have total output power from 0.1 mW to 1 W.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A light emitting device comprising:
    a substrate;
    a buffer layer on the substrate;
    a first active layer on the buffer layer, at least a first portion of the first active layer comprising a first electrical polarity; and
    a plurality of mesa regions on the first active layer, wherein each mesa region comprises:
        at least a second portion of the first active layer;
        a light emitting region on the second portion of the first active layer, the light emitting region having a thickness and being configured to emit light, the emitted light having a target wavelength, the light emitting region having at least one dimension parallel to the substrate smaller than 10 times the target wavelength, the emitted light being confined to fewer than 10 transverse modes, the thickness of the light emitting region being a multiple of the target wavelength, and the target wavelength being between 200 nm and 300 nm; and
        a second active layer on the light emitting region, at least a portion of the second active layer comprising a second electrical polarity.

2. The light emitting device of claim 1, wherein each mesa region has a shape selected from the group consisting of a rectangular prism, a hexagonal prism, a cylinder, and an elliptic cylinder.

3. The light emitting device of claim 1, wherein the light emitting region comprises a short-period superlattice.

4. The light emitting device of claim 3, wherein the short-period superlattice comprises $Al_xGa_{1-x}N$ wherein x is from 0 to 1.

5. The light emitting device of claim 1, wherein the light emitting region comprises one or more quantum wells and one or more barriers adjacent to the quantum wells.

6. The light emitting device of claim 5, wherein the one or more quantum wells comprises $Al_xGa_{1-x}N$ wherein x is from 0 to 1.

7. The light emitting device of claim 1, further comprising an electron blocking layer between the light emitting region and the second active layer.

8. The light emitting device of claim 1, wherein the emitted light is non-coherent, the emitted light intensity comprises a wavelength from 200 nm to 300 nm, and the light emitting device comprises a total output power from 0.1 mW to 1 W.

9. The light emitting device of claim 1, wherein the emitted light is coherent, the emitted light intensity comprises a wavelength from 200 nm to 300 nm, and the light emitting device comprises a total electrical-to-optical power efficiency from 0.1% to 90%.

* * * * *